(12) United States Patent
Matsumoto

(10) Patent No.: US 10,790,115 B2
(45) Date of Patent: Sep. 29, 2020

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 1 day.

(21) Appl. No.: 15/262,094

(22) Filed: Sep. 12, 2016

(65) Prior Publication Data

US 2017/0076912 A1 Mar. 16, 2017

(30) Foreign Application Priority Data

Sep. 14, 2015 (JP) .................................. 2015-180370

(51) Int. Cl.
*H01J 37/302* (2006.01)
*H01J 37/317* (2006.01)

(52) U.S. Cl.
CPC ...... *H01J 37/3023* (2013.01); *H01J 37/3177* (2013.01); *H01J 2237/30472* (2013.01); *H01J 2237/31774* (2013.01)

(58) Field of Classification Search
CPC ... H01J 2237/30472; H01J 2237/31774; H01J 37/3023; H01J 37/3177
See application file for complete search history.

(56) References Cited

U.S. PATENT DOCUMENTS 5,260,579 A * 11/1993 Yasuda .................. B82Y 10/00
250/492.2
8,258,488 B2 * 9/2012 Platzgummer ............ G03F 1/20
250/492.1

(Continued)

FOREIGN PATENT DOCUMENTS

| JP | 5-166707 A | 7/1993 |
| JP | 2014-112639 | 6/2014 |
| JP | 2015-2189 | 1/2015 |

OTHER PUBLICATIONS

Office Action dated Jul. 30, 2019 in Japanese Patent Application No. 2015-180370, citing document AO therein, 6 pages (with unedited computer generated English translation).

*Primary Examiner* — Wyatt A Stoffa
(74) *Attorney, Agent, or Firm* — Oblon, McClelland, Maier & Neustadt, L.L.P.

(57) ABSTRACT

A multi charged particle beam writing method includes assigning, for each unit irradiation region per beam of multi-beams, each divided shot obtained by dividing a shot of a maximum irradiation time and continuously irradiate the same unit irradiation region, to at least one of a plurality of beams that can be switched by collective deflection; calculating, for each unit irradiation region, an irradiation time; determining, for each unit irradiation region, whether to make each divided shot be beam "on" or "off" so that the total irradiation time for a plurality of corresponding divided shots to be beam "on" may become a combination equivalent to the irradiation time calculated; and applying, to the corresponding unit irradiation region, the plurality of corresponding divided shots to be beam "on", using the plurality of beams while switching a beam between beams by collective deflection.

9 Claims, 23 Drawing Sheets

(56) References Cited

U.S. PATENT DOCUMENTS

| | | | |
|---|---|---|---|
| 9,495,499 B2* | 11/2016 | Platzgummer | G06F 30/398 |
| 2010/0038554 A1* | 2/2010 | Platzgummer | G03F 1/20 |
| | | | 250/397 |
| 2012/0126136 A1* | 5/2012 | Ito | H01J 37/3177 |
| | | | 250/396 R |
| 2012/0286170 A1* | 11/2012 | Van De Peut | H01J 37/3177 |
| | | | 250/397 |
| 2014/0014852 A1* | 1/2014 | Wieland | H01J 37/3177 |
| | | | 250/396 R |
| 2014/0124684 A1* | 5/2014 | Matsumoto | H01J 37/3177 |
| | | | 250/492.3 |
| 2014/0187056 A1* | 7/2014 | Yoshikawa | H01J 37/3177 |
| | | | 438/798 |
| 2014/0319367 A1* | 10/2014 | Muraki | H01J 37/045 |
| | | | 250/397 |
| 2014/0367584 A1* | 12/2014 | Matsumoto | H01J 37/304 |
| | | | 250/396 R |
| 2015/0102231 A1* | 4/2015 | Matsumoto | H01J 37/3177 |
| | | | 250/396 R |
| 2015/0129779 A1* | 5/2015 | Morita | H01J 37/3177 |
| | | | 250/453.11 |
| 2015/0206709 A1* | 7/2015 | Nakayamada | H01J 37/3045 |
| | | | 250/491.1 |
| 2015/0248993 A1* | 9/2015 | Reiter | H01J 37/3177 |
| | | | 250/492.22 |
| 2016/0071696 A1* | 3/2016 | Kuiper | H01J 37/3177 |
| | | | 250/396 R |
| 2017/0207064 A1* | 7/2017 | Matsumoto | H01J 37/20 |

* cited by examiner

| tk | Beam |
|---|---|
| 512Δ | b |
| 256Δ | a |
| 128Δ | b |
| 64Δ | a |
| 32Δ | a |
| 16Δ | a |
| 8Δ | a |
| 4Δ | a |
| 2Δ | a |
| Δ | a |

FIG.10A

Sorting ⇨

| tk | Beam | Irradiation Time of Each Beam |
|---|---|---|
| 512Δ | b | 640Δ |
| 128Δ | b | |
| 256Δ | a | 383Δ |
| 64Δ | a | |
| 32Δ | a | |
| 16Δ | a | |
| 8Δ | a | |
| 4Δ | a | |
| 2Δ | a | |
| Δ | a | |

FIG.10B

| Divided Shot Order | k | k-1 | k-2 | k-3 | · · · |
|---|---|---|---|---|---|
| Beam 1 | 1 | 1 | 0 | 1 | · · · |
| Beam 2 | 1 | 1 | 0 | 0 | · · · |
| Beam 3 | 0 | 1 | 1 | 0 | · · · |
| Beam 4 | 0 | 1 | 1 | 1 | · · · |
| Beam 5 | 1 | 0 | 1 | 1 | · · · |
| · · | | | | | |

FIG.12

| tk | Beam |
|---|---|
| 512Δ | b |
| 256Δ | a |
| 128Δ | a |
| 64Δ | a |
| 32Δ | a |
| 16Δ | a |
| 8Δ | a |
| 4Δ | a |
| 2Δ | a |
| Δ | a |

Sorting ⇒

| tk | Beam | |
|---|---|---|
| 512Δ | b | 512Δ |
| 256Δ | a | |
| 128Δ | a | |
| 64Δ | a | |
| 32Δ | a | 511Δ |
| 16Δ | a | |
| 8Δ | a | |
| 4Δ | a | |
| 2Δ | a | |
| Δ | a | |

FIG.17A  FIG.17B

| tk | Beam |
|---|---|
| 256Δ | b |
| 256Δ | a |
| 128Δ | b |
| 128Δ | a |
| 128Δ | b |
| 64Δ | a |
| 32Δ | a |
| 16Δ | a |
| 8Δ | a |
| 4Δ | a |
| 2Δ | a |
| Δ | a |

512Δ { 256Δ, 256Δ }
256Δ { 128Δ, 128Δ }

Sorting ⇒

| tk | Beam | Irradiation Time of Each Beam |
|---|---|---|
| 256Δ | b | 512Δ |
| 128Δ | b | |
| 128Δ | b | |
| 256Δ | a | 511Δ |
| 128Δ | a | |
| 64Δ | a | |
| 32Δ | a | |
| 16Δ | a | |
| 8Δ | a | |
| 4Δ | a | |
| 2Δ | a | |
| Δ | a | |

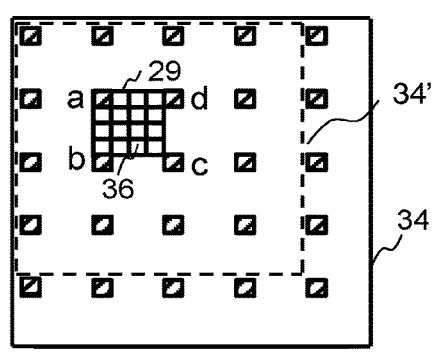# 
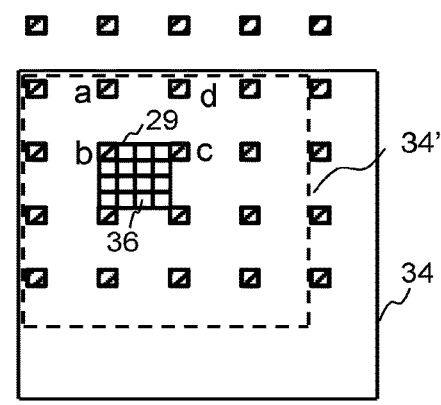
FIG.19A  FIG.19B
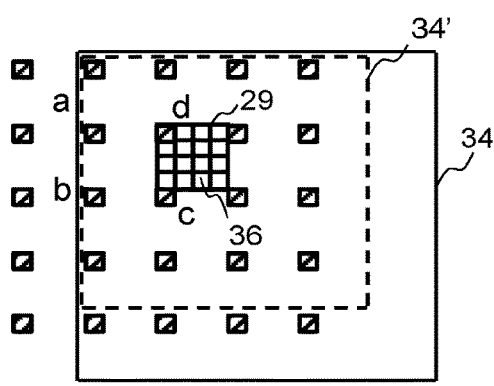 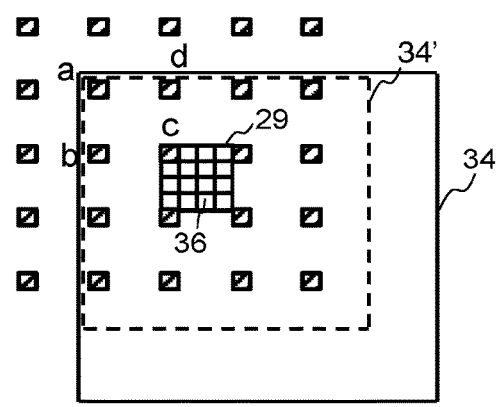
FIG.19D  FIG.19C

| tk | Beam |
|---|---|
| 128Δ | d |
| 128Δ | c |
| 128Δ | b |
| 128Δ | a |
| 128Δ | d |
| 128Δ | c |
| 128Δ | b |
| 64Δ | a |
| 32Δ | a |
| 16Δ | a |
| 8Δ | a |
| 4Δ | a |
| 2Δ | a |
| Δ | a |

512Δ (first four rows), 256Δ (next three rows)

Sorting ⇒

| tk | Beam | Irradiation Time of Each Beam |
|---|---|---|
| 128Δ | d | 256Δ |
| 128Δ | d | |
| 128Δ | c | 256Δ |
| 128Δ | c | |
| 128Δ | b | 256Δ |
| 128Δ | b | |
| 128Δ | a | 255Δ |
| 64Δ | a | |
| 32Δ | a | |
| 16Δ | a | |
| 8Δ | a | |
| 4Δ | a | |
| 2Δ | a | |
| Δ | a | |

FIG.20A　　　　FIG.20B

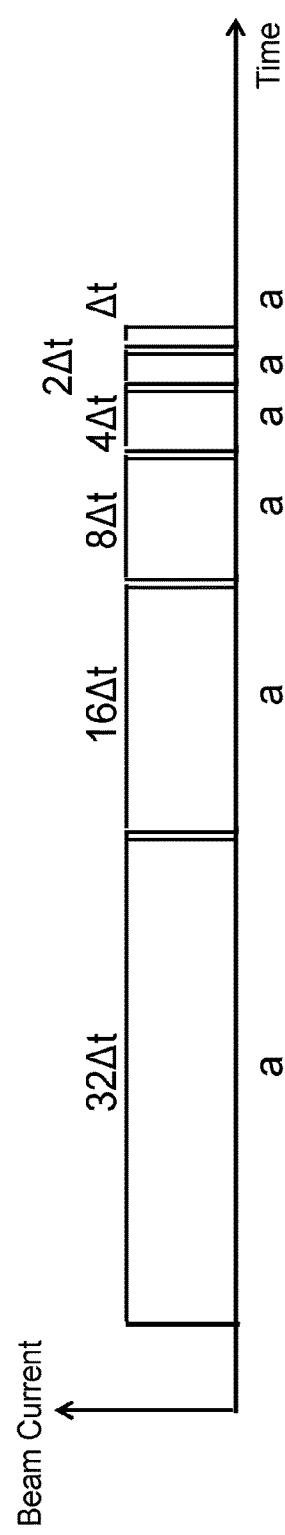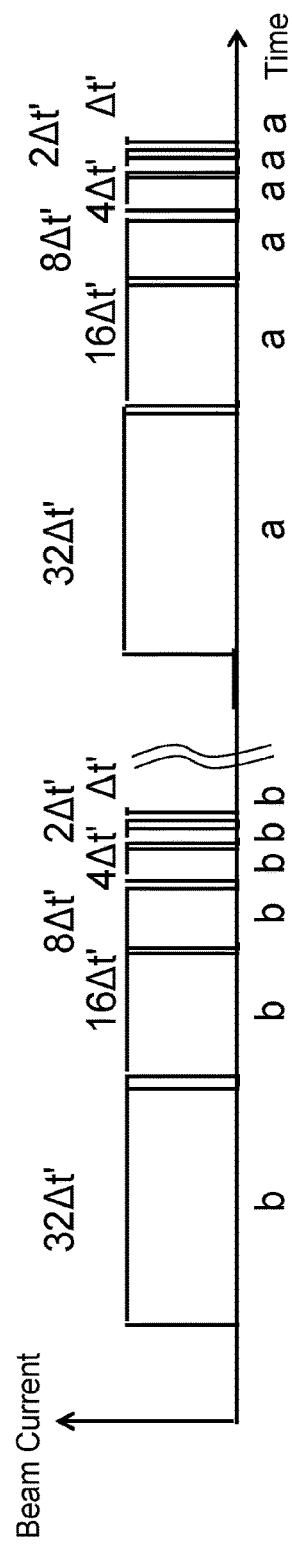

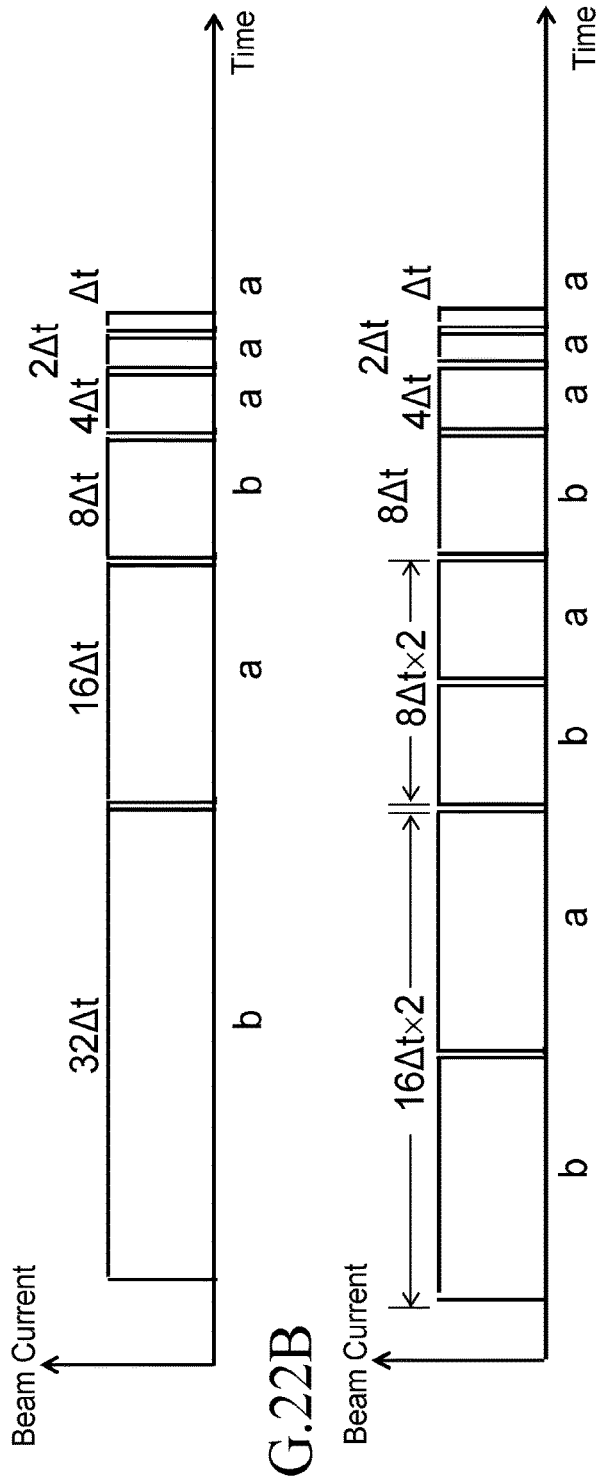

| Total Exposure Time T | Exposure Beam (a, b, off) | | | | | | Exposure Time of Beam "a" | Exposure Time of Beam "b" |
|---|---|---|---|---|---|---|---|---|
| | 32Δt | 16Δt | 8Δt | 4Δt | 2Δt | Δt | | |
| 63Δt | b | a | b | a | a | a | 23 | 40 |
| 60Δt | b | a | b | a | off | off | 20 | 40 |
| 40Δt | b | off | b | off | off | off | 0 | 40 |
| 31Δt | off | a | b | a | a | a | 23 | 8 |
| 23Δt | off | a | off | a | a | a | 23 | 0 |
| 7Δt | off | off | off | a | a | a | 7 | 0 |

FIG.23

| Total Exposure Time | Exposure Beam (a,b,c, off) | | | | | | Exposure Time of Beam "a" | Exposure Time of Beam "b" | Exposure Time of Beam "c" |
|---|---|---|---|---|---|---|---|---|---|
| | 32Δt | 16Δt | 8Δt | 4Δt | 2Δt | Δt | | | |
| 63Δt | c | b | a | a | a | a | 15 | 16 | 32 |
| 60Δt | c | b | a | a | off | off | 12 | 16 | 32 |
| 40Δt | c | off | a | off | off | off | 8 | 0 | 32 |
| 31Δt | off | b | a | a | a | a | 15 | 16 | 0 |
| 23Δt | off | b | off | a | a | a | 7 | 16 | 0 |
| 7Δt | off | off | off | a | a | a | 7 | 0 | 0 |

FIG.24

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2015-180370 filed on Sep. 14, 2015 in Japan, the entire contents of which are incorporated herein by reference.

BACKGROUND OF THE INVENTION

Field of the Invention

Embodiments of the present invention relate generally to a multi charged particle beam writing method and a multi charged particle beam writing apparatus, and more specifically, relate, for example, to a beam irradiation method of multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" patterns on a wafer and the like with electron beams.

As a known example of employing the electron beam writing technique, there is a writing apparatus using multi-beams. Since it is possible for multi-beam writing to irradiate multiple beams at a time, the writing throughput can be greatly increased in comparison with single beam writing. A writing apparatus employing the multi-beam technique, for example, forms multi-beams by letting portions of an electron beam emitted from an electron gun pass through a corresponding hole of a plurality of holes in a mask, performs blanking control for each beam, reduces each unblocked beam by an optical system, and deflects it by a deflector so as to irradiate a desired position on a target object or "sample".

In multi-beam writing, the dose of each beam is individually controlled by the irradiation time. Regarding the multi-beam writing, there is proposed a method of dividing a shot of irradiation time required for irradiating the same position into a plurality of times of irradiation steps, and of irradiating a target object continuously with the same beam during each irradiation step (for example, refer to Japanese Unexamined Patent Application Publication (JP-A) No. 2015-002189).

Concerning the multi-beam writing, a processing error occurs, due to the limit of processing accuracy, at the aperture diameter of a plurality of holes of the mask for forming multi-beams. Therefore, an error occurs at the diameter of a beam formed by passing through such a hole. Thus, an error occurs in the beam current amount. Consequently, an error also occurs in the dose of irradiation with such a beam. Even if a plurality of beams having passed through the same hole continuously irradiate the target object, it is difficult to reduce the dose error.

BRIEF SUMMARY OF THE INVENTION

According to one aspect of the present invention, a multi charged particle beam writing method includes: assigning, for each unit irradiation region of unit irradiation regions of a target object, per beam of multi-beams, each divided shot of a plurality of divided shots, which are obtained by dividing a shot of a maximum irradiation time and continuously irradiate a same unit irradiation region in the unit irradiation regions, to at least one of a plurality of beams that can be switched by collective deflection of the multi-beams; calculating, for the each unit irradiation region, an irradiation time of a beam irradiating a corresponding unit irradiation region in the unit irradiation regions; determining, for the each unit irradiation region, whether to make the each divided shot of the plurality of divided shots beam "on" or beam "off" so that a total irradiation time for a plurality of corresponding divided shots to be beam "on" in the plurality of divided shots becomes a combination equivalent to the irradiation time calculated; and applying, to the corresponding unit irradiation region in the unit irradiation regions, the plurality of corresponding divided shots to be beam "on" in the plurality of divided shots continuously irradiating the same unit irradiation region, using the plurality of beams while switching a beam for the plurality of corresponding divided shots between the plurality of beams by collective deflection of the multi-beams.

According to another aspect of the present invention, a multi charged particle beam wring apparatus includes: an assignment processing circuitry configured to assign, for each unit irradiation region of unit irradiation regions of a target object, per beam of multi-beams configured by charged particle beams, each divided shot of a plurality of divided shots, which are obtained by dividing a shot of a maximum irradiation time and continuously irradiate a same unit irradiation region, to at least one of a plurality of beams that can be switched by collective deflection of the multi-beams; an irradiation time calculation processing circuitry configured to calculate, for the each unit irradiation region, an irradiation time of a beam irradiating a corresponding unit irradiation region in the unit irradiation regions; a determination processing circuitry configured to determine, for the each unit irradiation region, whether to make the each divided shot of the plurality of divided shots beam "on" or beam "off" so that a total irradiation time for a plurality of corresponding divided shots to be beam "on" in the plurality of divided shots becomes a combination equivalent to the irradiation time calculated; and a writing mechanism, including a charged particle source, a deflector and a stage on which a target object is placed, configured to write a pattern on the target object with the multi-beams, while applying, to the corresponding unit irradiation region in the unit irradiation regions, the plurality of corresponding divided shots to be beam "on" in the plurality of divided shots continuously irradiating the same unit irradiation region, using the plurality of beams to switch a beam for the plurality of corresponding divided shots between the plurality of beams by collective deflection of the multi-beams.

BRIEF DESCRIPTION OF THE DRAWINGS

FIGS. 10A and 10B show an example of assignment between a plurality of divided shots and beams according to the first embodiment;

FIG. 12 shows an example of a part of irradiation time array data according to the first embodiment;

FIGS. 17A and 17B show an example of assignment between a plurality of divided shots and beams in a comparative example of a second embodiment;

FIGS. 18A and 18B show an example of assignment between a plurality of divided shots and beams according to the second embodiment;

FIGS. 19A to 19D illustrate beam switching performed in the middle of applying a plurality of divided shots according to a third embodiment;

FIGS. 20A and 20B show an example of assignment between a plurality of divided shots and beams according to the third embodiment;

FIGS. 21A and 21B show examples of an exposure sequence in a comparative example to each of embodiments;

FIGS. 22A to 22C show examples of an exposure sequence for comparing embodiments;

FIG. 23 shows an example of comparing each beam exposure time when writing is performed while switching two beams according to the first embodiment; and FIG. 24 shows an example of comparing each beam exposure time when writing is performed while switching three beams according to a modified example of the first embodiment.

DETAILED DESCRIPTION OF THE INVENTION

Embodiments of the present invention describe a multi-beam writing method and apparatus that can reduce dose errors due to an error of the diameter of apertures for forming multi-beams.

In the embodiments below, there is described a configuration in which an electron beam is used as an example of a charged particle beam. The charged particle beam is not limited to the electron beam, and other charged particle beam such as an ion beam may also be used.

First Embodiment

Figure 1:
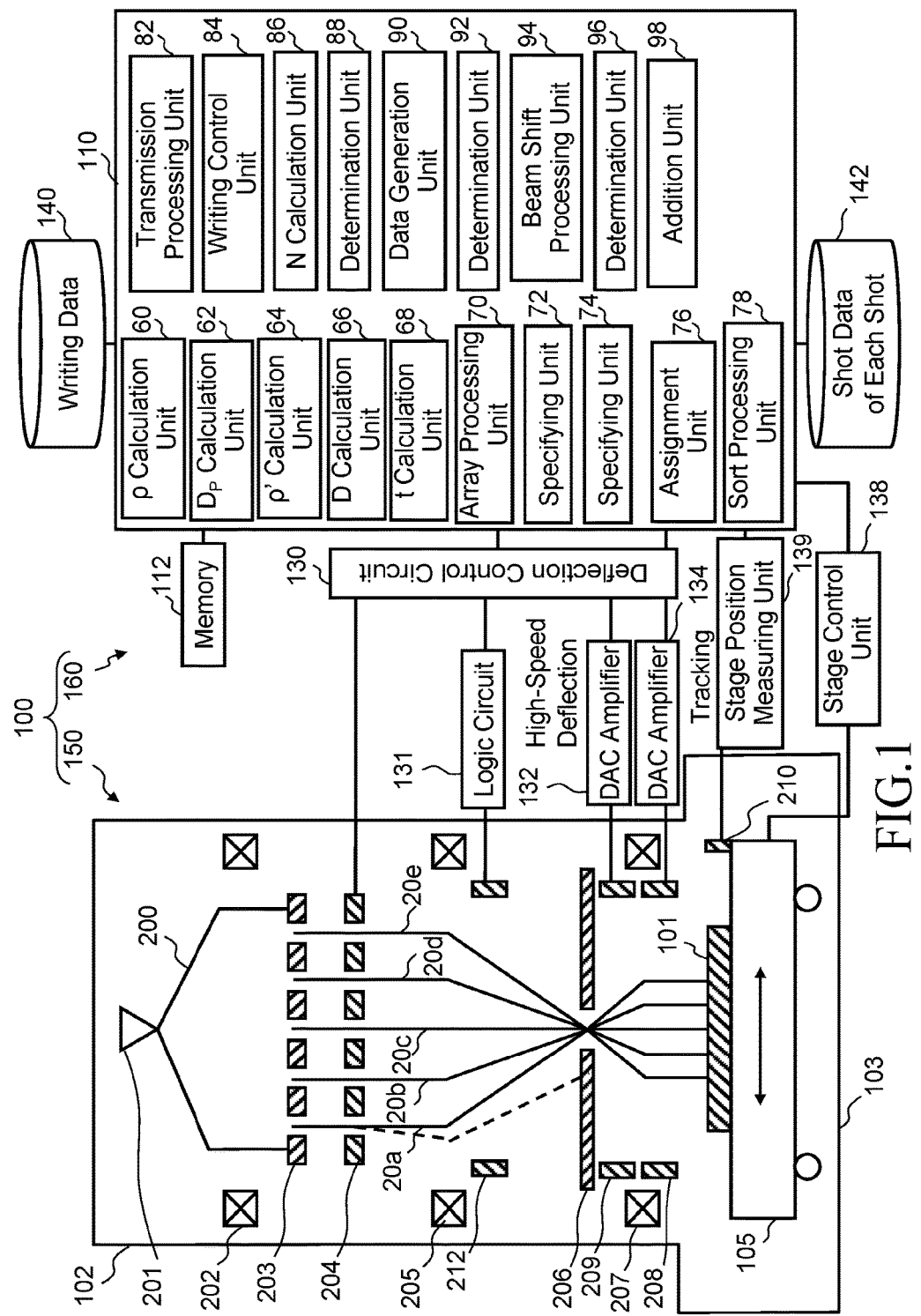
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a forming aperture array substrate 203, a blanking aperture array mechanism 204, a reducing lens 205, a deflector 212 for common blanking, a limiting aperture substrate 206, an objective lens 207, and deflectors 208 and 209. In the writing chamber 103, an XY stage 105 is arranged. On the XY stage 105, a target object or "sample" 101 such as a mask serving as a writing target substrate is placed when writing is performed. The target object 101 is, for example, an exposure mask used for manufacturing semiconductor devices, or is a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 is arranged on the XY stage 105.

The control unit 160 includes a control computer 110, a memory 112, a deflection control circuit 130, a logic circuit 131, DAC (digital-analog converter) amplifier units 132 and 134, a stage control unit 138, a stage position measuring unit 139, and storage devices 140 and 142 such as magnetic disk drives. The control computer 110, the memory 112, the deflection control circuit 130, the stage control unit 138, the stage position measuring unit 139, and the storage devices 140 and 142 are connected with each other through a bus (not shown). Writing data is input from the outside of the writing apparatus 100 into the storage device 140 (storage unit) and stored therein. The deflection control circuit 130 is connected to the logic circuit 131, the DAC amplifier circuits 130 and 132, and the blanking aperture array mechanism 204 through a bus. The logic circuit 131 is connected to the deflector 212. The stage position measuring unit 139 irradiates the mirror 210 on the XY stage 105 with a laser beam, and receives a catoptric light from the mirror 210. Then, the stage position measuring unit 139 measures the position of the XY stage 105 by using information of the catoptric light.

In the control computer 110, there are arranged a pattern area density ρ calculation unit 60, a proximity effect correction irradiation coefficient $D_p$ calculation unit 62, a pattern area density ρ' in pixel calculation unit 64, a dose D calculation unit 66, an irradiation time t calculation unit 68, an array processing unit 70, a specifying unit 72, a specifying unit 74, an assignment unit 76, a sort processing unit 78, a gray-scale value N calculation unit 86, a determination unit 88, a data generation unit 90, a determination unit 92, a beam shift processing unit 94, a determination unit 96, an addition unit 98, a transmission processing unit 82, and a writing control unit 84. Each " . . . unit", such as the pattern area density ρ calculation unit 60, the proximity effect correction irradiation coefficient $D_p$ calculation unit 62, the pattern area density ρ' in pixel calculation unit 64, the dose D calculation unit 66, the irradiation time t calculation unit 68, the array processing unit 70, the specifying unit 72, the specifying unit 74, the assignment unit 76, the sort processing unit 78, the gray-scale value N calculation unit 86, the determination unit 88, the data generation unit 90, the determination unit 92, the beam shift processing unit 94, the determination unit 96, the addition unit 98, the transmission processing unit 82, and the writing control unit 84 includes a processing circuitry. In the processing circuitry, for example, an electric circuit, computer, processor, circuit board, quantum circuit, semiconductor device, and the like are included. Each "... unit" may use a common processing circuitry (same processing circuitry), or different processing circuitries (separate processing circuitries). Data which is input and output to/from the pattern area density ρ calculation unit 60, the proximity effect correction irradiation coefficient $D_p$ calculation unit 62, the pattern area density ρ' in pixel calculation unit 64, the dose D calculation unit 66, the irradiation time t calculation unit 68, the array processing unit 70, the specifying unit 72, the specifying unit 74, the assignment unit 76, the sort processing unit 78, the gray-scale value N calculation unit 86, the determination unit 88, the data generation unit 90, the determination unit 92, the beam shift processing unit 94, the determination unit 96, the addition unit 98, the transmission processing unit 82, and the writing control unit 84, and data being operated are stored in the memory 112 each time.

FIG. 1 shows configuration elements necessary for describing the first embodiment. It should be understood that other configuration elements generally necessary for the writing apparatus 100 may also be included therein.

Figure 2:
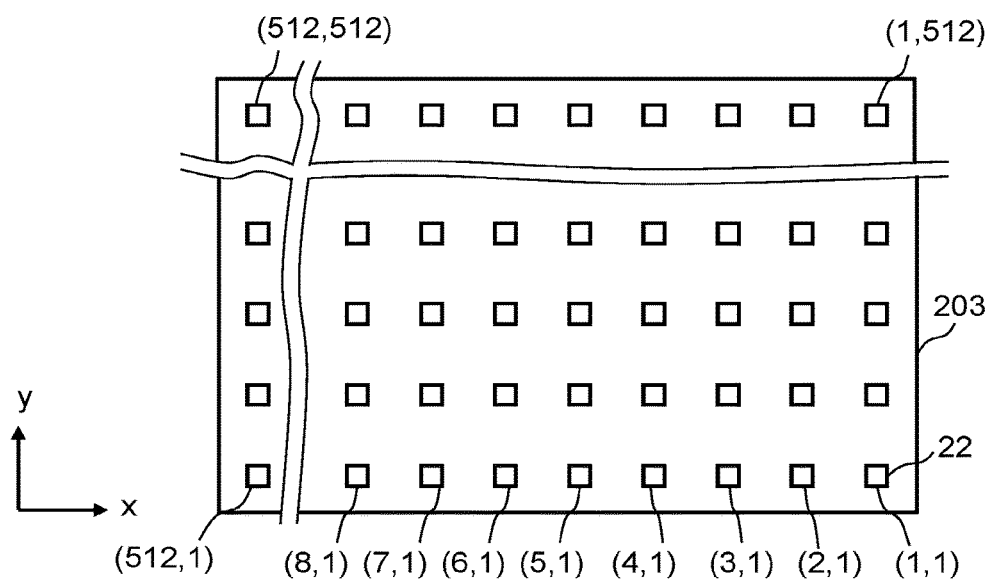
FIG. 2 is a conceptual diagram showing a configuration of a forming aperture array substrate according to the first embodiment.

FIG. 2 is a conceptual diagram showing a configuration of a forming aperture array substrate according to the first embodiment. As shown in FIG. 2, holes (openings) 22 of m rows long (y direction) and n columns wide (x direction) (m≥2, n≥2) are formed, like a matrix, at a predetermined arrangement pitch in the forming aperture array substrate 203. In FIG. 2, for example, holes 22 of 512 (rows in y direction)×512 (columns in x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
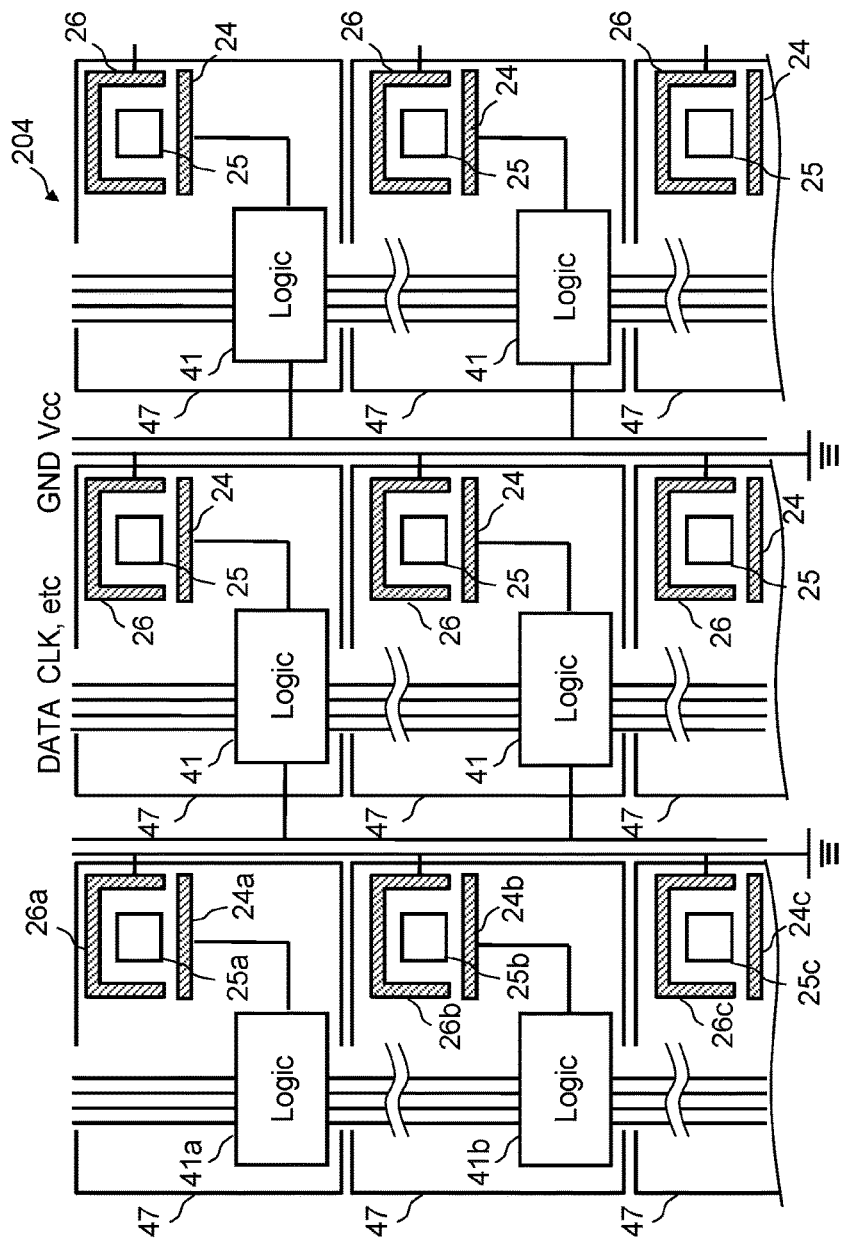
FIG. 3 is a top view conceptual diagram showing a part of a blanking aperture array mechanism according to the first embodiment.

FIG. 3 is a top view conceptual diagram showing a part of a blanking aperture array mechanism according to the first embodiment. In FIG. 3, the positional relation of electrodes 24 and 26 and the positional relation of a control circuit 41 are not in accordance with each other. As shown in FIG. 3, in the blanking aperture array mechanism 204, there are formed passage holes 25 (openings), through which multiple beams individually pass, at the positions each corresponding to each hole 22 of the forming aperture array substrate 203 of FIG. 2. Then, a pair of electrodes 24 and 26 (blanker: blanking deflector) for blanking deflection is arranged close to each passage hole 25 in a manner such that the electrodes 24 and 26 are opposite each other with respect to the passage hole 25 concerned. Moreover, close to each passage hole 25, there is arranged a control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, 1-bit line for control signal is connected to each control circuit 41. In addition to the 1-bit line, for example, a clock signal line, a power source line, and the like are connected to each control circuit 41. An individual blanking system 47 composed of the electrodes 24 and 26 and the control circuit 41 is configured for each beam of multi-beams. A control signal for each control circuit 41 is output from the deflection control circuit 130. Moreover, a shift register to be described later is arranged in each control circuit 41, and for example, shift registers for beams in one row of n×m multi beams in the control circuit are connected in series. For example, control signals for beams in one row of the n×m multi beams are transmitted in series. For example, a control signal of each beam is stored in a corresponding control circuit 41 by clock signals of n times.

The electron beam 20 passing through a corresponding passage hole is independently deflected by the voltage applied to the two electrodes 24 and 26 being a pair. Blanking control is performed by this deflection. Blanking deflection is performed for each corresponding beam of the multi-beams. Thus, each of a plurality of blankers performs blanking deflection of a corresponding beam of the multi-beams having passed through a plurality of holes 22 (openings) of the forming aperture array substrate 203.

Figure 4:
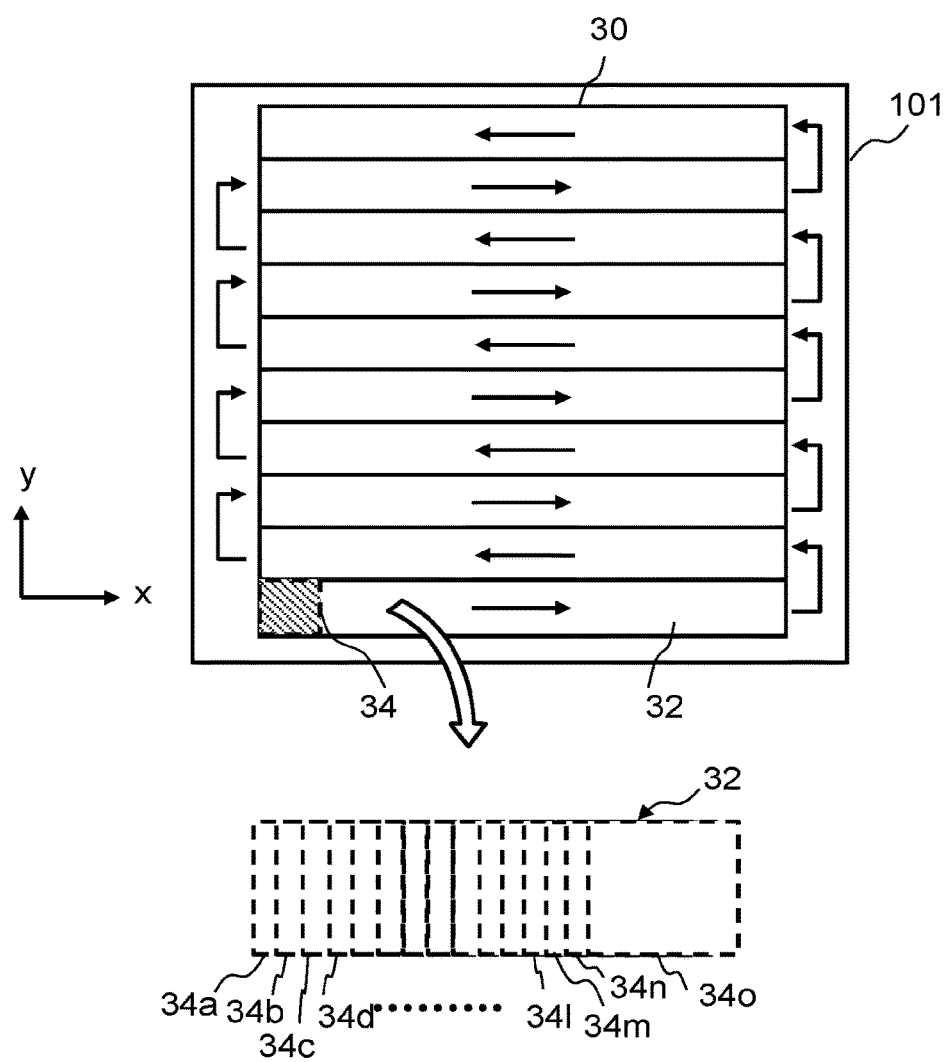
FIG. 4 is a conceptual diagram explaining an example of a writing operation according to the first embodiment.

FIG. 4 is a conceptual diagram explaining an example of a writing operation according to the first embodiment. As shown in FIG. 4, a writing region 30 of the target object 101 is virtually divided into a plurality of stripe regions 32 each in a strip shape and each having a predetermined width in the y direction, for example. First, the XY stage 105 is moved to make an adjustment such that an irradiation region 34 which may be irradiated with one irradiation of the multi-beams 20 is located at the left end of the first stripe region 32 or at a position more left than the left end, and then writing is started. For example, when writing the first stripe region 32 by moving the XY stage 105 in the −x direction, the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position more right than the right end and located relatively in the y direction, and then, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns are generated at a time by one shot (total of divided shots, to be described later) of multi-beams which have been formed bypassing through each of the holes 22 of the forming aperture array substrate 203, that is, the number of shot patterns generated at a time is equal to the number of the holes 22 at the maximum.

Figure 5:
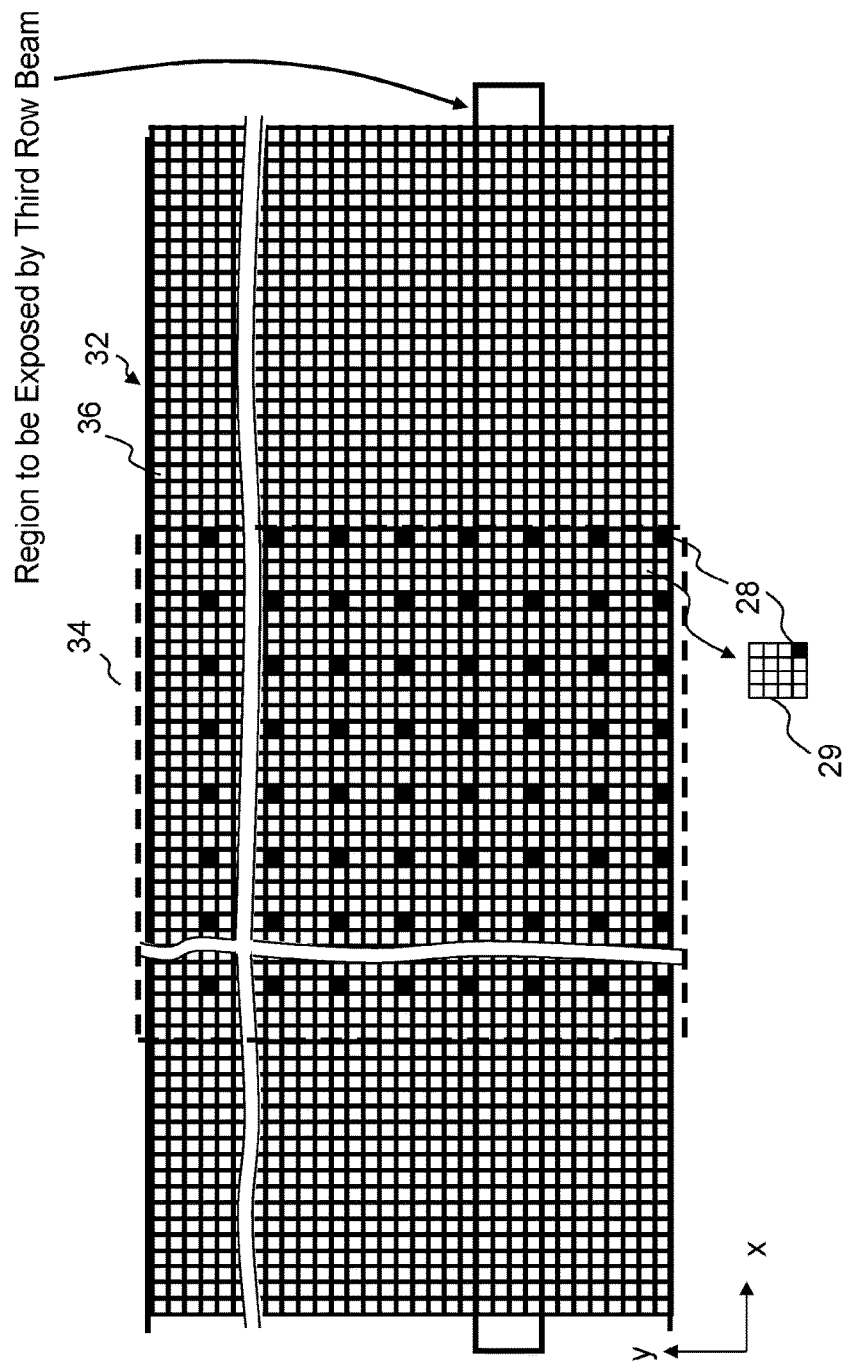
FIG. 5 shows an example of an irradiation region of multi-beams and a writing target pixel according to the first embodiment.

FIG. 5 shows an example of an irradiation region of multi-beams and a pixel to be written (writing target pixel) according to the first embodiment. In FIG. 5, the stripe region 32 is divided into a plurality of mesh regions by the size of a beam of multi-beams, for example. Each mesh region serves as a writing target pixel 36 (unit irradiation region, or writing position). The size of the writing target pixel 36 is not limited to the beam size, and it may be an arbitrary size regardless of the beam size. For example, it may be 1/n (n being an integer of 1 or more) of the beam size. FIG. 5 shows the case where the writing region of the target object 101 is divided in the y direction into a plurality of stripe regions 32 by the width size being substantially the same as the size of the irradiation region 34 which can be irradiated by one irradiation of the multi-beam 20, for example. The width of the stripe region 32 is not limited to this. It is also preferable for the width of the stripe region 32 to be n times (n being an integer of 1 or more) the size of the irradiation region 34. FIG. 5 shows the case of multi-beams of 512×512 (rows by columns). In the irradiation region 34, there are shown a plurality of pixels 28 (writing positions of beams) which can be irradiated by one irradiation of the multi-beams 20. In other words, the pitch between the adjacent pixels 28 is the pitch between beams of the multi-beams. In the example of FIG. 5, one grid 29 is a square region surrounded at four corners by four adjacent pixels 28, and it includes one of the four pixels 28. In the example of FIG. 5, each grid 29 is configured by 4×4 pixels.

Figure 6:
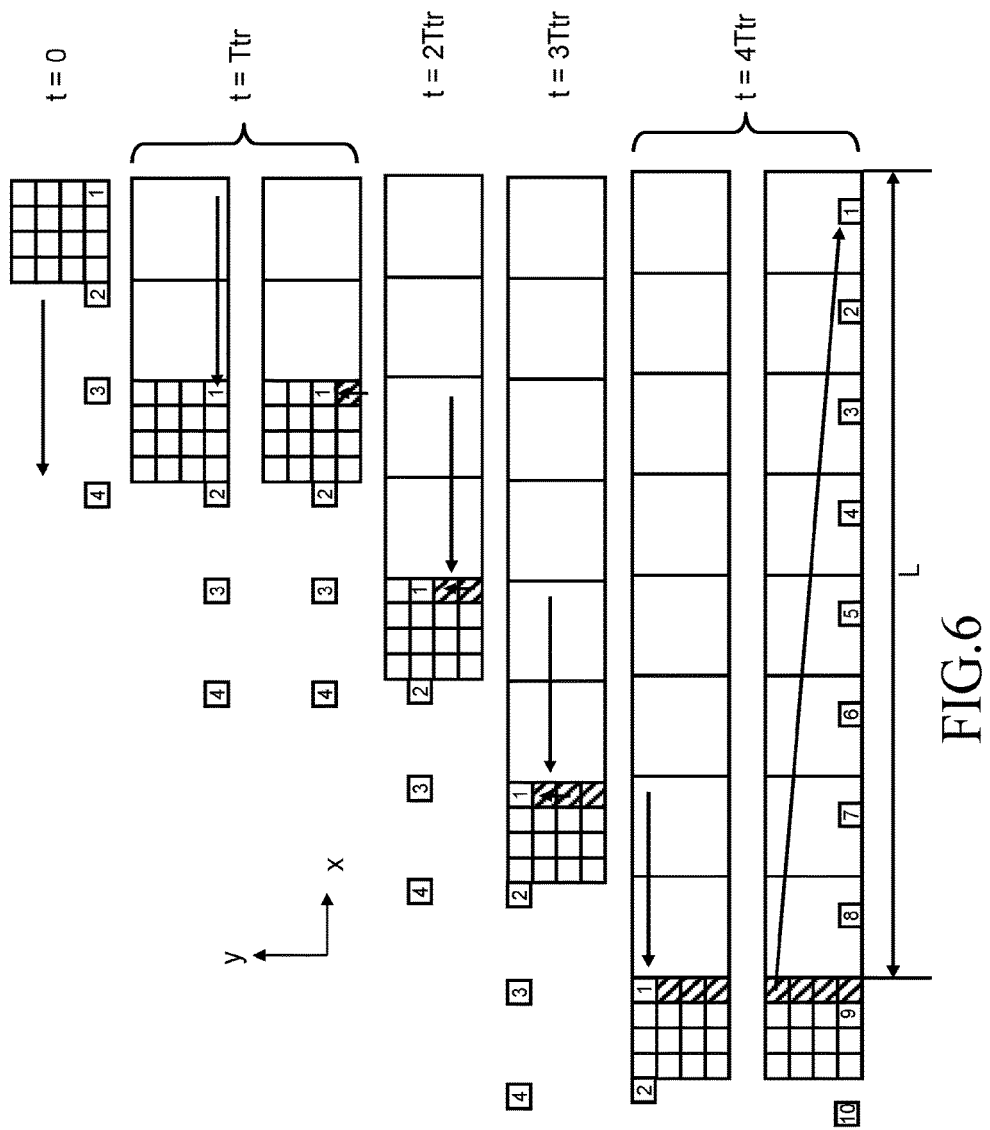
FIG. 6 illustrates an example of a writing method of multi-beams according to the first embodiment.

FIG. 6 illustrates an example of a writing method of multi-beams according to the first embodiment. FIG. 6 shows some grids to be written by respective beams at the coordinates (1, 3), (2, 3), (3, 3), ..., (512, 3) in the third row in the y direction from the bottom in the multi-beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 in a manner where the entire multi-beams 20 is collectively deflected by the deflector 208. In other words, tracking control is performed. In the example of FIG. 6, one tracking cycle is executed by writing (exposing) four pixels while moving the distance of eight beam pitches.

Specifically, the stage position detector 139 measures the position of the XY stage 105 by irradiating a laser onto the mirror 210 and receiving a catoptric light from the mirror 210. The measured position of the XY stage 105 is output to the control computer 110. In the control computer 110, the writing control unit 84 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 illuminates each pixel 36 with a corresponding beam in the "on" state in the multi-beams 20 during a writing time corresponding to each pixel 36 within the maximum writing time Ttr of the irradiation time of each beam of the multi-beams of the shot concerned (total of divided shots, to be described later). According to the first embodiment, one shot is divided into a plurality of divided shots to be described later, and these plurality of divided shots are performed during one shot operation. Furthermore, according to the first embodiment, when applying these plurality of divided shots to each pixel 36, beam switching is performed in the middle of irradiation to execute remaining divided shots. First, regarding a plurality of divided shots as one shot, the operation of each shot is described below.

In the example of FIG. 6, during from the time t=0 to t=Ttr being the maximum writing time, using a beam (1) of coordinates (1, 3) (reference beam) and a switch beam which is described later, beam irradiation of the first shot composed of a plurality of divided shots is performed to the first pixel from the right in the bottom row of the grid 29 concerned ("target grid", or "grid of interest"). For example, irradiation of the first half of a shot composed of a plurality of divided shots is performed with a beam (1), and then, beam switching is performed to execute irradiation of the remaining half of the shot composed of a plurality of divided shots with a switch beam. Alternatively, irradiation of the first half of a shot composed of a plurality of divided shots is performed with a switch beam, and then, beam switching is performed to execute irradiation of the remaining half of the shot composed of a plurality of divided shots with the beam (1). The state after the switching is not illustrated in FIG. 6. The XY stage 105 moves, for example, two beam pitches in the −x direction by during from the time t=0 to t=Ttr. During this time period, the tracking operation is continuously performed.

After the maximum writing time Ttr of the shot concerned has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 6, when the time becomes t=Ttr, the pixel to be written (writing target pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective beams in the "on" state in the multi-beams 20 are applied to shifted writing positions corresponding to the respective beams during a writing time corresponding to each of the respective beams within a maximum writing time Ttr of the shot concerned. In the example of FIG. 6, the first pixel from the right in the second row from the bottom of the grid 29 concerned is irradiated by the second shot using the beam (1) of coordinates (1, 3) and a switch beam, which is described later, during the time from t=Ttr to t=2 Ttr, for example. The XY stage 105 moves two beam pitches in the −x direction during the time from t=Ttr to t=2 Ttr, for example. During this time period, the tracking operation is continuously performed.

In the example of FIG. 6, when the time becomes t=2 Ttr, the pixel to be written (writing target pixel) is shifted from the first pixel from the right in the second row from the bottom of the grid 29 concerned to the first pixel from the right in the third row from the bottom by collectively deflecting the multi-beams by the deflector 209. Since the XY stage 105 is moving also during this time period, the tracking operation is continuously performed. Then, the first pixel from the right in the third row from the bottom of the grid 29 concerned is irradiated by the third shot using the beam (1) of coordinates (1, 3) and a switch beam during the time from t=2 Ttr to t=3 Ttr, for example. The XY stage 105 moves two beam pitches in the −x direction during the time from t=2 Ttr to t=3 Ttr, for example. During this time period, the tracking operation is continuously performed. When the time becomes t=3 Ttr, the pixel to be written (writing target pixel) is shifted from the first pixel from the right in the third row from the bottom of the grid 29 concerned to the first pixel from the right in the fourth row from the bottom by collectively deflecting the multi-beams by the deflector 209. Since the XY stage 105 is moving also during this time period, the tracking operation is continuously performed. Then, the first pixel from the right in the fourth row from the bottom of the grid 29 concerned is irradiated by the fourth shot using the beam (1) of coordinates (1, 3) and a switch beam during the time from t=3 Ttr to t=4 Ttr, for example. The XY stage 105 moves two beam pitches in the −x direction during the time from t=3 Ttr to t=4 Ttr, for example. During this time period, the tracking operation is continuously performed. By the process described above, writing of the pixels in the first column from the right of the grid 29 concerned has been completed.

In the example of FIG. 6, after emitting a corresponding beam while switching the beam to the writing position of each beam which has been shifted three times from the initial position, the DAC amplifier 134 returns the tracking position to the start position of tracking where the tracking control was started, by resetting the beam deflection for tracking control. In other words, the tracking position is returned in the opposite direction to the direction of the stage movement. In the example of FIG. 6, when the time becomes t=4 Ttr, tracking of the grid 29 concerned is released (removed), and the beam is swung back to a new target grid which has been shifted by eight beam pitches in the x direction. Although the beam (1) of the coordinates (1, 3) has been described in the example of FIG. 6, writing is also similarly performed for each grid corresponding to a beam of other coordinates. That is, a beam of coordinates (n, m) completes writing of pixels in the first column from the right of a corresponding grid when the time becomes t=4 Ttr. For example, a beam (2) of coordinates (2, 3) completes writing of pixels in the first column from the right of a grid adjacent in the −x direction to the grid 29 concerned for the beam (1) of FIG. 6.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, each shot (a plurality of divided shots) is performed while shifting the irradiation position pixel by pixel by the deflector 209, in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 4, the first shot position is adjusted to be the position shifted by one pixel, for example. Then, while performing a next tracking control, each shot is performed shifting the irradiation position by one pixel by the deflector 209. By repeating this operation during writing the stripe region 32, the position of the irradiation region 34 is shifted one by one, such as from 34a to 34o, to perform writing of the stripe region concerned.

Figure 7:
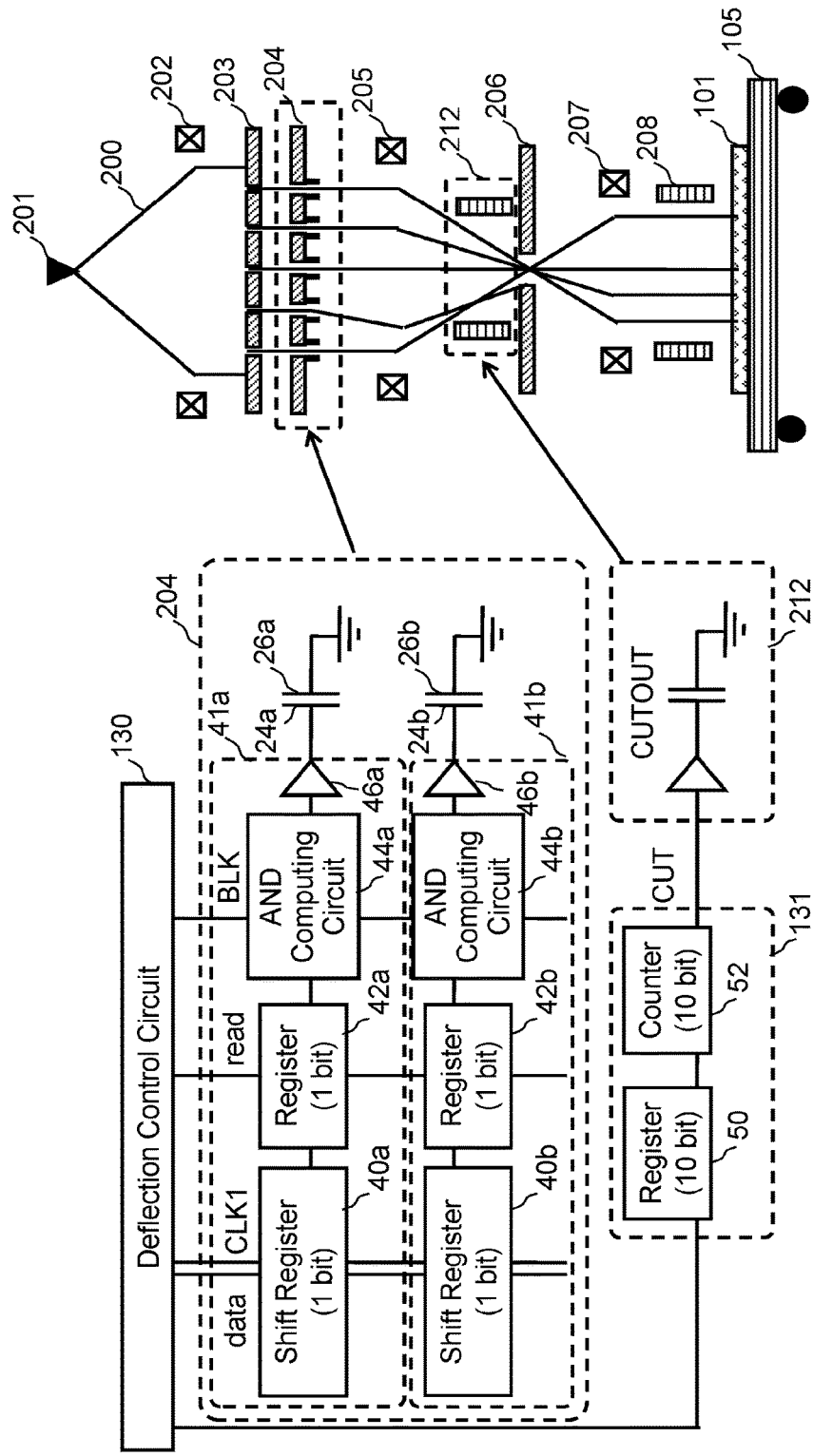
FIG. 7 is a schematic diagram showing the internal configuration of an individual blanking control circuit and a common blanking control circuit according to the first embodiment.

FIG. 7 is a schematic diagram showing the internal configuration of an individual blanking control circuit and a common blanking control circuit according to the first embodiment. As shown in FIG. 7, a shift register 40, a register 42, an AND computing circuit 44, and an amplifier 46 are arranged in each logic circuit 41 for controlling individual blanking arranged in the blanking aperture array mechanism 204 in the body of the writing apparatus 100. The AND computing circuit 44 may be omitted. According to the first embodiment, for example, a 1-bit control signal is used for individual blanking control for each beam, which has conventionally been controlled by, for example, a 10-bit control signal. That is, a 1-bit control signal is input/output into/from the shift register 40, register 42, and AND computing circuit 44. Since the amount of information of the control signal is small, the installation area of the control circuit can be made small. In other words, even when a logic circuit is arranged on the blanking aperture array mechanism 204 whose installation space is small, more beams can be arranged at a smaller beam pitch. This increases the amount of current passing through the blanking aperture array mechanism 204, and therefore, improves the writing throughput.

Moreover, an amplifier is arranged in the deflector 212 for common blanking, and a register 50 and a counter 52 are arranged in the logic circuit 131. These do not simultaneously perform several different controls, and therefore, it is sufficient to use one circuit to perform on/off control. Accordingly, even when arranging a circuit for a high speed response, no problem occurs with respect to restriction on the installation space and the current to be used in the circuit. Therefore, this amplifier operates at very high speed compared to an amplifier realizable on the blanking aperture. This amplifier is controlled by a 10-bit control signal, for example. That is, for example, a 10-bit control signal is input/output to/from the register 50 and the counter 52.

According to the first embodiment, blanking control of each beam is performed by using both the beam on/off control by each logic circuit 41 for individual blanking control and the beam on/off control by the logic circuit 131 for common blanking control that collectively performs blanking control of the entire multi beams.

Figure 8:
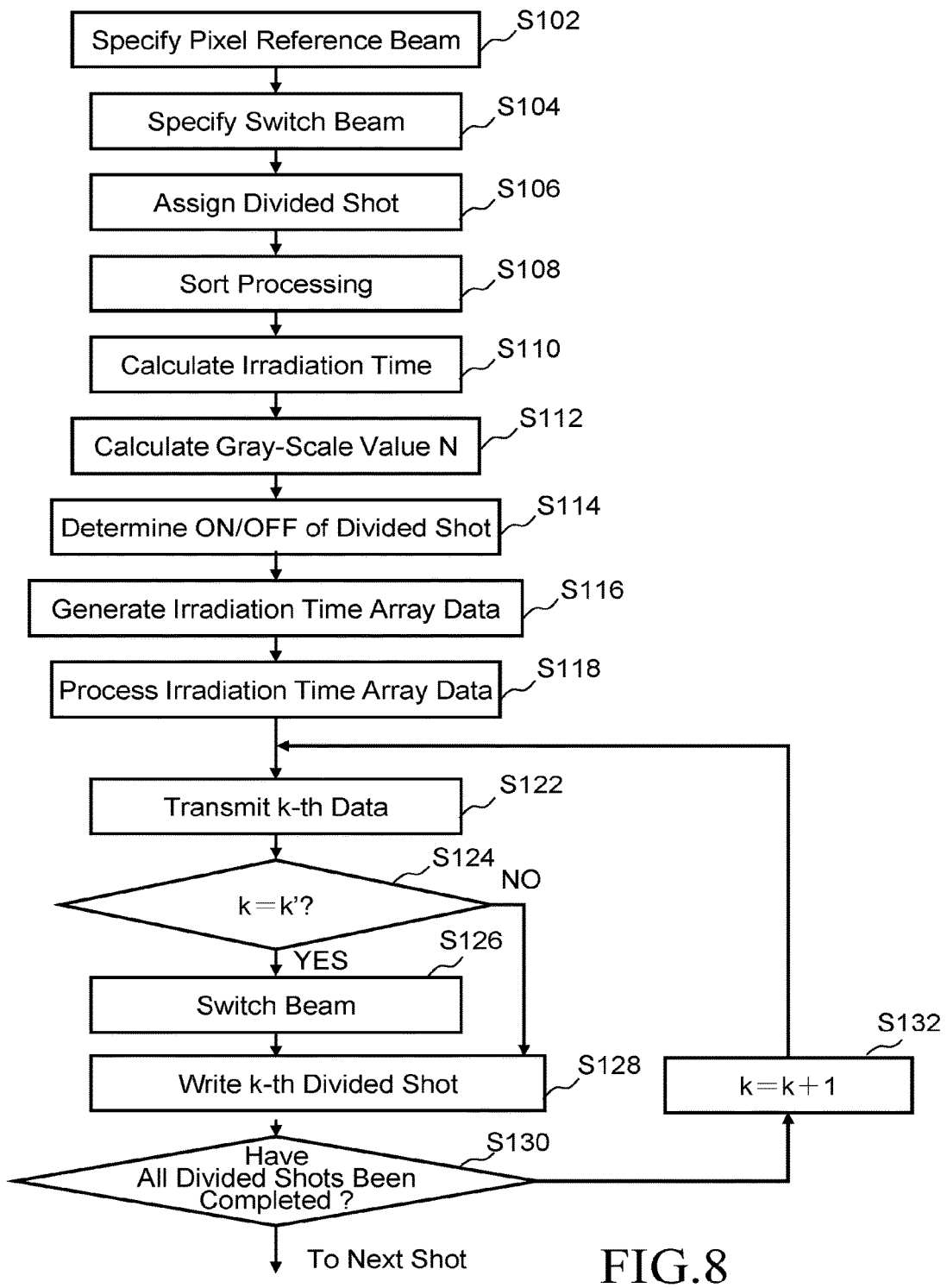
FIG. 8 is a flowchart showing main steps of a writing method according to the first embodiment.

FIG. 8 is a flowchart showing main steps of a writing method according to the first embodiment. As shown in FIG. 8, the writing method of the first embodiment executes, for each shot, a series of steps: a reference beam specifying step (S102) for each pixel, a switch beam specifying step (S104), a divided shot assigning step (S106), a sort processing step (S108), an irradiation time calculation step (S110), a grayscale value N calculation step (S112), a divided shot ON/OFF determination step (S114), an irradiation time array data generation step (S116), an irradiation time array data processing step (S118), a k-th data transmission step (S122), a determination step (S124), a beam switching step (S126), a k-th divided shot step (S128), a determination step (S130), and an addition step (S132).

In the reference beam specifying step (S102) for each pixel, the specifying unit 72 specifies, for each pixel 36, a reference beam to irradiate the pixel concerned. In multi-beam writing, as described with reference to FIGS. 4 to 6, writing of the stripe region 30 proceeds by repeating the tracking cycle while shifting the pixel to be written. It depends on the writing sequence which beam of the multi-beams irradiates which pixel 36. For each pixel 36, the specifying unit 70 specifies a beam for the pixel 36 concerned which has been defined depending on the writing sequence, as a reference beam. In the example of FIG. 6, the beam (1) of coordinates (1, 3) is specified as a reference beam for the first pixel from the right in the bottom row of the grid 29 concerned ("target grid" or "grid of interest") with respect to the shot concerned (total of a plurality of divided shots).

In the switch beam specifying step (S104), the specifying unit 74 specifies, for each pixel 36, a beam that can be switched by collective deflection of multi-beams, as a switch beam to irradiate the pixel concerned.

Figures 9A, 9B:
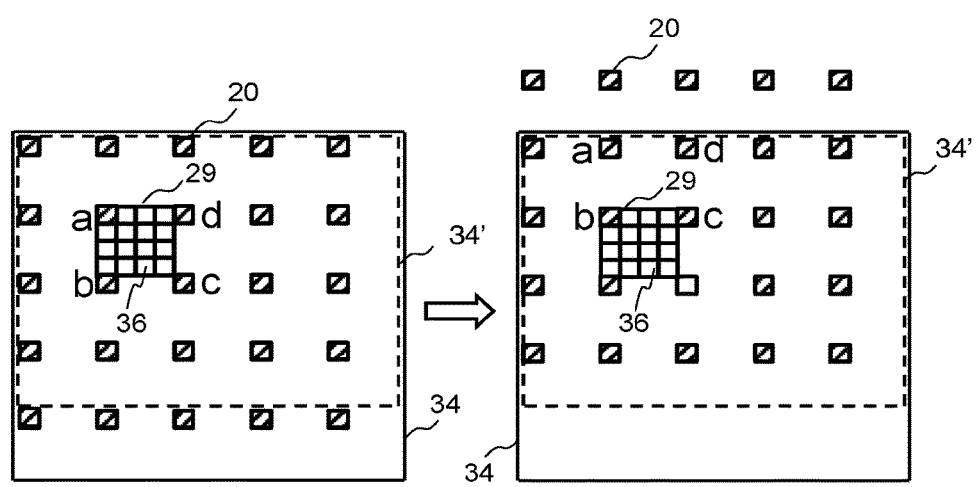
FIGS. 9A and 9B illustrate beam switching performed in the middle of applying a plurality of divided shots according to the first embodiment.

FIGS. 9A and 9B illustrate beam switching performed in the middle of applying a plurality of divided shots according to the first embodiment. FIG. 9A shows the case of performing a shot to the target object by using multi-beams 20 of 5×5 (rows by columns). Specifically, for example, FIG. 9A shows the case where a beam "a" of the multi-beams 20, as a reference beam, takes charge of the first pixel 36 from the left in the top row of the grid 29 concerned ("grid 29 of interest" or "target grid 29"). The beam "a" is the second beam from the left in the second row from the top of the multi-beams 20 of 5×5 irradiating the irradiation region 34 which can be irradiated at a time (one shot of the multi-beams 20). After, for example, the first to eighth divided shots in a plurality of divided shots have been performed with the beam "a", the beam irradiation position of the multi-beams 20 of 5×5 is shifted upward in FIG. 9A by one beam pitch by collective deflection of the deflector 209. Thereby, as shown in FIG. 9B, the beam which takes charge of the first pixel 36 from the left in the top row of the grid 29 concerned is switched to the beam "b" from the beam "a". Then, the beam "b" takes charge of the remaining divided shots in a plurality of divided shots. By this, the first pixel 36 from the left in the top row of the grid 29 concerned is multiply exposed by the two beams "a" and "b". Therefore, even when the diameter of the hole 22 (aperture) of the forming aperture array substrate 203 for forming the beam "a" has a processing error against the design value, the error of the beam current amount can be equalized by superimposingly applying the beam "b". As a result, the error of the dose to the pixel concerned can be reduced. For example, by applying the two beams "a" and "b", statistical errors of variation in beam current irradiating the pixel 36 concerned can be reduced compared with applying the beam "a" only. For example, if it is possible to make the irradiation time periods of two beams the same, the statistical error of variation in beam current can be reduced to $\frac{1}{2}^{(1/2)}$ times compared with applying the beam "a" only. Although the case of precedently performing a divided shot of a reference beam (beam "a") is described in FIGS. 9A and 9B, it is also preferable to precedently perform a divided shot of a switch beam (beam "b") as will be described later. As shown in FIG. 9B, beams which become out of the irradiation region 34 can be used for exposure of pixels in the upward adjacent stripe. Therefore, it is necessary for each stripe to have the same x-coordinate of the start point, x-coordinate of the end point, and exposure order of pixels in the stripe concerned. Alternatively, an irradiation region 34' smaller than the irradiation region 34 may be defined, and the height of the stripe 30 should be identical to the height of the irradiation region 34'. Thus, it is preferable that the writing processing including the processing of FIG. 8 can be completed in each stripe. As shown in FIG. 9B, the beams becoming out of the irradiation region 34' are controlled to be OFF in order not to expose a pixel. Alternatively, it is also preferable to configure each of the apertures 203 and 204 to be larger, by one row, than the beam array needed for configuring the irradiation region.

Although the example of FIGS. 9A and 9B shows the case where the multi-beams 20 of 5×5 are collectively deflected upward (y direction) by one beam pitch by the deflector 209, it is not limited thereto. For example, the multi-beams 20 of 5×5 may be collectively deflected leftward (x direction) by one beam pitch by the deflector 209. Alternatively, it is also preferable to collectively deflect the multi-beams 20 of 5×5 rightward (−x direction) by one beam pitch by the deflector 209. Alternatively, it is also preferable to collectively deflect the multi-beams 20 of 5×5 downward (−y direction) by one beam pitch by the deflector 209. Moreover, the beam shift amount is not limited to the amount of one beam pitch. It may be two or more beam pitches. As long as the beam shift amount is an integral multiple of the beam pitch deflectable by the deflector 209, switching to any one of beams can be performed.

In the divided shot assigning step (S106), for each pixel 36 (unit irradiation region) of the target object 101 per beam of the multi-beams 20, the assignment unit 76 assigns each of a plurality of divided shots, which are obtained by dividing a shot of the maximum irradiation time Ttr and each of which has a different irradiation time to continuously irradiate the same pixel 36, to at least one of a plurality of beams that can be switched by collective deflection of the multi-beams 20. According to the first embodiment, each divided shot of a plurality of divided shots is assigned to one of a plurality of beams that can be switched by collective deflection of the multi-beams 20, for example.

FIGS. 10A and 10B show an example of assignment between a plurality of divided shots and beams according to the first embodiment. In the first embodiment, one shot of the maximum irradiation time Ttr is divided into n divided shots which continuously irradiate the same pixel 36 and each of which has a different irradiation time. First, a gray-scale value Ntr is defined by dividing the maximum irradiation time Ttr by a quantization unit $\Delta$ (gray-scale value resolution). For example, when n=10, it is divided into ten divided shots. When defining the gray-scale value Ntr by n-digit binary value, the quantization unit $\Delta$ should be set in advance such that the gray-scale value Ntr is Ntr=1023. By this, the maximum irradiation time Ttr is Ttr=1023$\Delta$. As shown in FIG. 10A, each of n divided shots has one of the irradiation time of 512$\Delta$(=$2^9\Delta$), 256$\Delta$(=$2^8\Delta$), 128$\Delta$(=$2^7\Delta$), 64$\Delta$(=$2^6\Delta$), 32$\Delta$(=$2^5\Delta$), 16$\Delta$(=$2^4\Delta$), 8$\Delta$(=$2^3\Delta$), 4$\Delta$(=$2^2\Delta$), 2$\Delta$(=$2^1\Delta$), and $\Delta$(=$2^0\Delta$). That is, one shot of multi-beams is divided into a divided shot having the irradiation time tk of 512$\Delta$, a divided shot having the irradiation time tk of 256$\Delta$, a divided shot having the irradiation time tk of 128$\Delta$, a divided shot having the irradiation time tk of 64$\Delta$, a divided shot having the irradiation time tk of 32$\Delta$, a divided shot having the irradiation time tk of 16$\Delta$, a divided shot having the irradiation time tk of 8$\Delta$, a divided shot having the irradiation time tk of 4$\Delta$, a divided shot having the irradiation time tk of 2$\Delta$, and a divided shot having the irradiation time tk of $\Delta$.

Therefore, an arbitrary irradiation time t(=N$\Delta$) for irradiating each pixel 36 can be defined by at least one combination of 512$\Delta$(=$2^9\Delta$), 256$\Delta$(=$2^8\Delta$), 128$\Delta$(=$2^7\Delta$), 64$\Delta$(=$2^6\Delta$), 32$\Delta$(=$2^5\Delta$), 16$\Delta$(=$2^4\Delta$), 8$\Delta$(=$2^3\Delta$), 4$\Delta$(=$2^2\Delta$), $2\Delta (=2^1\Delta)$, $\Delta (=2^0\Delta)$, and zero (0). For example, when there is a shot whose N is N=50, since $50=2^5+2^4+2^1$, it means a combination of a divided shot having the irradiation time of $2^5\Delta$, a divided shot having the irradiation time of $2^4\Delta$, and a divided shot having the irradiation time of $2^1\Delta$. When converting the gray-scale value N of an arbitrary irradiation time t for irradiating each pixel 36 into a binary number, it is preferable to define to use a value of a possible larger number of digits.

With respect to each pixel, for example, the assignment unit 76 assigns a divided shot having the irradiation time tk of $512\Delta$ to a switch beam (beam "b"), a divided shot having the irradiation time tk of $256\Delta$ to a reference beam (beam "a"), and a divided shot having the irradiation time tk of $128\Delta$ to a switch beam (beam "b"). The assignment unit 76 assigns a divided shot having the irradiation time tk of $64\Delta$, a divided shot having the irradiation time tk of $32\Delta$, a divided shot having the irradiation time tk of $16\Delta$, a divided shot having the irradiation time tk of $8\Delta$, a divided shot having the irradiation time tk of $4\Delta$, a divided shot having the irradiation time tk of $2\Delta$, and a divided shot having the irradiation time tk of $\Delta$ to a reference beam (beam "a").

It should be set in advance which divided shot is assigned to a reference beam and which divided shot is assigned to a switch beam. Here, a plurality of divided shots should be assigned to the actual reference beam and the actual switch beam which are specified for each pixel. In each exposure of n-time divided shots, the ratio of contribution of variation in beam current to the dose for exposing the pixel 36 is proportional to the irradiation time (exposure time) of each divided shot. Therefore, from a viewpoint of reducing the variation in beam current for each beam, it is more effective to assign a divided shot having a long irradiation time (exposure time) to a plurality of beams. In the case of FIG. 10A, it has a great effect to use a plurality of beams for a divided shot having a long irradiation time (exposure time), such as around the divided shots of $512\Delta$, $256\Delta$, and $128\Delta$ being top three, but, contrarily, it is less effective to use a plurality of beams for a divided shot around $64\Delta$ or below. Therefore, according to the first embodiment, beam switching is performed for upper-ranking divided shots each having a long irradiation time (exposure time).

In the sort processing step (S108), the sort processing unit 78 performs processing for sorting execution orders of divided shots to be collected per beam. By sorting by beam unit, the times of beam switching operations can be reduced, and therefore, the writing time can be shortened. In the case of FIG. 10B, the divided shots of which a switch beam (beam "b") takes charge are previously collected, and then, the divided shots of which a reference beam (beam "a") takes charge follow them. Specifically, sorting is performed in the order of a divided shot having the irradiation time tk of $512\Delta$ by the switch beam (beam "b"), a divided shot having the irradiation time tk of $128\Delta$ by the switch beam (beam "b"), a divided shot having the irradiation time tk of $256\Delta$ by the reference beam (beam "a"), a divided shot having the irradiation time tk of $64\Delta$ by the reference beam (beam "a"), a divided shot having the irradiation time tk of $32\Delta$ by the reference beam (beam "a"), a divided shot having the irradiation time tk of $16\Delta$ by the reference beam (beam "a"), a divided shot having the irradiation time tk of $8\Delta$ by the reference beam (beam "a"), a divided shot having the irradiation time tk of $4\Delta$ by the reference beam (beam "a"), a divided shot having the irradiation time tk of $2\Delta$ by the reference beam (beam "a"), and a divided shot having the irradiation time tk of $\Delta$ by the reference beam (beam "a").

In the example of FIG. 10B, with respect to a plurality of divided shots of which the same beam takes charge, a divided shot having a longer irradiation time tk is precedently performed, but it is not limited thereto. It is also preferable to precedently perform a divided shot having a shorter irradiation time tk in a plurality of divided shots of which the same beam takes charge. Alternatively, a divided shot may be performed at a random order regarding the irradiation time tk in a plurality of divided shots of which the same beam takes charge.

In the irradiation time calculation step (S110), for each pixel 36 (unit irradiation region), the irradiation time (beam irradiation time required for the pixel 36 concerned) of a beam irradiating the pixel 36 concerned is calculated. It is specifically calculated as described below.

The $\rho$ calculation unit 60 virtually divides the writing region (here, for example, stripe region 32) into a plurality of proximity mesh regions (mesh regions for proximity effect correction calculation) by a predetermined size. The size of the proximity mesh region is preferably about 1/10 of the influence radius of the proximity effect, such as about 1 µm. The $\rho$ calculation unit 60 reads writing data from the storage device 140, and calculates, for each proximity mesh region, a pattern area density $\rho$ of a pattern arranged in the proximity mesh region concerned.

Next, the $D_p$ calculation unit 62 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate a pattern area density $\rho$. Moreover, the correction model of the proximity effect correction irradiation coefficient $D_p$ and its calculation method may be the same as those used in the conventional single beam writing system.

The $\rho'$ calculation unit 64 calculates, for each pixel 36, a pattern area density $\rho'$ in the pixel 36 concerned. The mesh size of $\rho'$ is set to be the same as the size of a pixel 28.

The D calculation unit 66 calculates, for each pixel (writing target pixel) 36, a dose for irradiating the pixel 36 concerned. The dose D can be calculated, for example, by multiplying a pre-set reference dose $D_{base}$, a proximity effect correction irradiation coefficient $D_p$, and a pattern area density $\rho'$. Thus, it is preferable to obtain the dose D to be in proportion to a pattern area density calculated for each pixel 36. Next, the t calculation unit 68 calculates, for each pixel 36, an electron beam irradiation time t for making the calculated dose D incident on the pixel 36 concerned. The irradiation time t can be calculated by dividing the dose D by a current density J.

In the gray-scale value N calculation step (S112), the gray-scale value N calculation unit 86 calculates gray-scale value N data being integers by dividing the irradiation time t acquired for each pixel 36 by a quantization unit $\Delta$ (gray scale value resolution). The gray-scale value N data is defined by gray scale values from 0 to 1023, for example. The quantization unit $\Delta$ can be variously set, and, for example, it can be defined by 1 ns (nanosecond), etc. It is preferable that a value of 1 to 10 ns, for example, is used as the quantization unit $\Delta$. Here, as described above, the quantization unit $\Delta$ is set such that the gray-scale value Ntr of the maximum irradiation time Ttr per shot is 1023. However, it is not limited thereto. What is necessary is to set the quantization unit $\Delta$ so that the gray-scale value Ntr of the maximum irradiation time Ttr may be 1023 or less.

In the divided shot ON/OFF determination step (S114), the determination unit 88 determines, for each pixel 36, whether to make each divided shot of a plurality of divided shots beam ON or beam OFF so that the total irradiation time of divided shots to be beam ON may be a combination equivalent to a calculated beam irradiation time. The irradiation time t acquired for each pixel 36 is defined by the following equation (1) using an integer $w_k$ indicating either value 0 or 1, and an irradiation time $T_k$ of the k-th divided shot in n divided shots. The divided shot whose integer $w_k$ is 1 is determined to be ON, and the divided shot whose integer $w_k$ is 0 (zero) is determined to be OFF.

$$t = \sum_{k=1}^{n} w_k T_k \quad (1)$$

Figure 11:
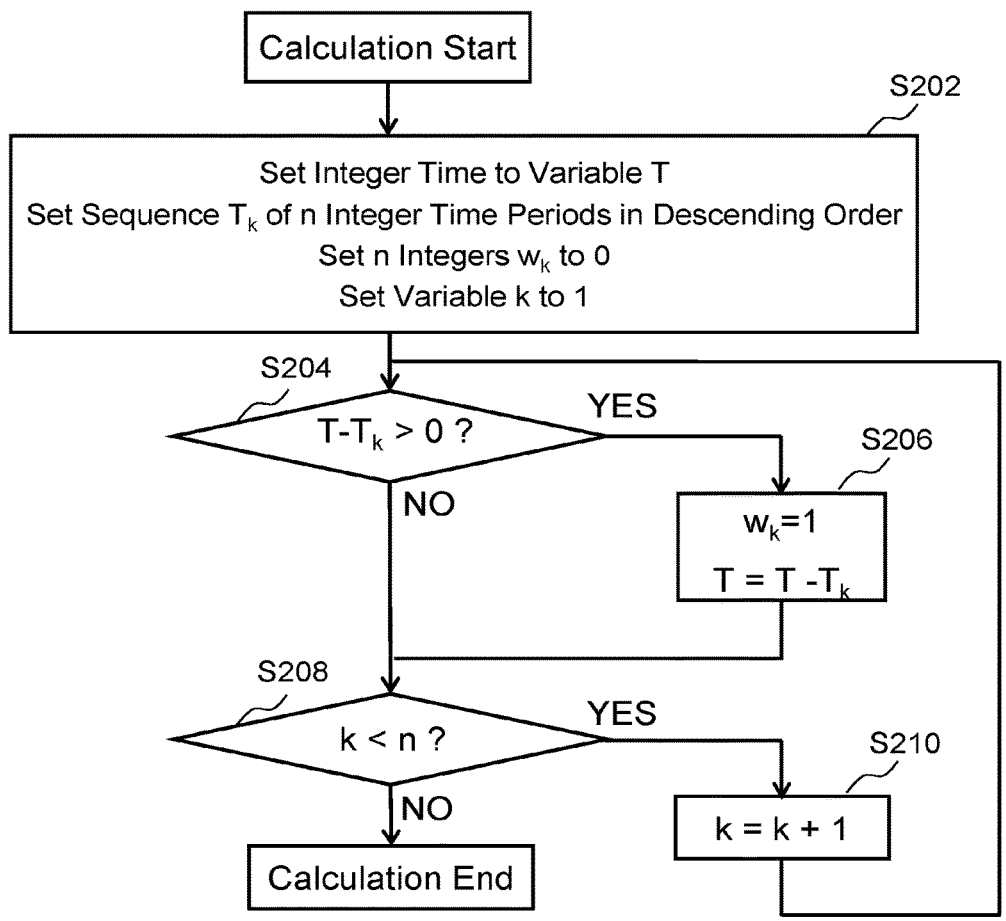
FIG. 11 is a flowchart showing the step of a method for determining ON or OFF of a divided shot according to the first embodiment.

FIG. 11 is a flowchart showing the step of a method for determining ON or OFF of a divided shot according to the first embodiment. The determination unit 88 performs each step of the flowchart shown in FIG. 11.

First, in an initial setting step (S202), a variable T=NΔ is set. When converting the gray-scale value N of an arbitrary irradiation time t for irradiating each pixel 36 into a binary number, it is preferable to define to use a value of a possible larger number of digits. Therefore, the sequence $T_k$ of n integer time periods is set in descending order. Here, n=10 and the sequence $T_k$={512Δ(=T1), 256Δ(=T2), 128Δ(=T3), 64Δ(=T4), 32Δ(=T5), 16Δ(=T6), 8Δ(=T7), 4Δ(=T8), 2Δ(=T9), Δ(=T10)} are set. n integers $w_k$(s) are all set to "0", and the variable k is set to "1".

In a determination step (S204), it is determined whether a variable T-$T_k$>0. If T-$T_k$>0, it proceeds to a setting step (S206). If not T-$T_k$>0, it proceeds to a determination step (S208).

In the setting step (S206), $w_k$=1 is set. Moreover, T=T-$T_k$ is calculated. After the calculation, it proceeds to the determination step (S208).

In the determination step (S208), it is determined whether the variable k<n. If k<n, it proceeds to an addition step (S210). If not k<n, it ends.

In the addition step (S210), 1 is added to the variable k (k=k+1). Then, it returns to the determination step (S204). Then, steps form the determination step (S204) to the addition step (S210) are repeated until it becomes "not k<n" in the determination step (S208).

For example, when N=700, T1=512Δ. Then, 700Δ-512Δ=188Δ. Thus, T-T1>0. Therefore, w1=1 is set in the setting step (S206). Moreover, it becomes T=700Δ-512Δ=188Δ. If k=1, 1<10. Therefore, after calculating k=k+1, it returns to the determination step (S204). By similarly repeating, it becomes w1=1, w2=0, w3=1, w4=0, w5=1, w6=1, w7=1, w8=1, w9=0, and w10=0. Therefore, it can be determined that the divided shot of T1 is ON, the divided shot of T2 is OFF, the divided shot of T3 is ON, the divided shot of T4 is OFF, the divided shot of T5 is ON, the divided shot of T6 is ON, the divided shot of T7 is ON, the divided shot of T8 is ON, the divided shot of T9 is OFF, and the divided shot of T10 is OFF.

In the irradiation time array data generation step (S116), the data generation unit 90 generates irradiation time array data of a divided shot for dividing one shot into a plurality of divided shots which continuously irradiate the same position and each of which has a different irradiation time. The data generation unit 90 generates, for each pixel 36, irradiation time array data of a divided shot to be applied to the pixel concerned. For example, when N=50, 50=$2^5$+$2^4$+$2^1$. Therefore, it becomes "0000110010". For example, when N=500, it becomes "0111110100". When N=700, it becomes "1010111100". When N=1023, it becomes "1111111111".

In the irradiation time array data processing step (S118), the array processing unit 70 processes irradiation time array data in the order of shots of beams. As explained with reference to FIG. 6, the pixel 36 adjacent in the direction of stage movement is not necessarily shot followingly. Therefore, the array processing unit 70 processes the order of the data such that the irradiation time array data of each pixel 36 is arranged in the order of pixels 36 shot by the multi-beams 20 sequentially in accordance with the writing sequence. Further, even in one shot, since the order of divided shots has been changed by the sort processing step (S108), the order of the irradiation time array data of each pixel 36 is also changed to be in accordance with the changed order of divided shots.

FIG. 12 shows an example of a part of irradiation time array data according to the first embodiment. FIG. 12 shows a part of irradiation time array data of a predetermined shot with respect to beams, such as beams 1 to 5, in the multi-beams. The example of FIG. 12 shows irradiation time array data of from the k-th divided shot to the (k-3)th divided shot concerning the beams 1 to 5. For example, as to the beam 1, data "1101" is shown for the divided shots from the k-th divided shot to the (k-3)th divided shot. As to the beam 2, data "1100" is shown for the divided shots from the k-th divided shot to the (k-3)th divided shot. As to the beam 3, data "0110" is shown for the divided shots from the k-th divided shot to the (k-3)th divided shot. As to the beam 4, data "0111" is shown for the divided shots from the k-th divided shot to the (k-3)th divided shot. As to the beam 5, data "1011" is shown for the divided shots from the k-th divided shot to the (k-3)th divided shot. The processed irradiation time array data is stored in the storage device 142.

In the k-th data transmission step (S122), the transmission processing unit 82 outputs, for each shot of each beam (a plurality of divided shots for each shot concerned), irradiation time array data to the deflection control circuit 130. The deflection control circuit 130 outputs, for each divided shot, the irradiation time array data to the logic circuit 41 for each beam. Moreover, synchronized with this, the deflection control circuit 130 outputs timing data of each divided shot to the logic circuit 131 for common blanking.

As explained with reference to FIG. 7, since the shift register 40 is used for the logic circuit 41, the deflection control circuit 130 transmits data of divided shots each having the same order in each shot to each logic circuit 41 of the blanking aperture array mechanism 204, where the transmission is performed in the order of beam array (or in the order of identification number). For example, the blankers arranged in a matrix in the blanking aperture array mechanism 204 are grouped by the row or column, and data is transmitted per group. Moreover, a clock signal (CLK1) for synchronization, a read signal (read) for data read-out, and an AND computing circuit signal (BLK signal) are output. In the case of FIG. 12, for example, as the k-th data of the beams 1 to 5, each one bit data of "10011" is transmitted from the posterior beam side. The shift register 40 of each beam transmits data to the next shift register 40 in order from the high-order side, based on a clock signal (CLK1). For example, with respect to the k-th data of the beams 1 to 5, based on clock signals of five times, one bit data "1" is stored in the shift register 40 of the beam 1. One bit data "1" is stored in the shift register 40 of the beam 2. One bit data "0" is stored in the shift register 40 of the beam 3. One bit data "0" is stored in the shift register 40 of the beam 4. One bit data "1" is stored in the shift register 40 of the beam 5.

Next, in response to an input of a read signal (read), the register 42 of each beam reads the k-th data of each beam from the shift register 40. In the example of FIG. 12, one bit data "1" is stored, as the k-th data, in the register 42 of the beam 1. One bit data "1" is stored, as the k-th data, in the register 42 of the beam 2. One bit data "0" is stored, as the k-th data, in the register 42 of the beam 3. One bit data "0" is stored, as the k-th data, in the register 42 of the beam 4. One bit data "1" is stored, as the k-th data, in the register 42 of the beam 5. When inputting the k-th data, the individual register 42 of each beam outputs an on/off signal to the AND computing circuit 44, based on the input k-th data. If the k-th data is "1", an "on" signal is output, and if it is "0", an "off" signal is output. Then, when the BLK signal is an "on" signal and the signal of the register 42 is "on", the AND computing circuit 44 outputs an "on" signal to the amplifier 46, and then, the amplifier 46 applies an "on" voltage to the electrode 24 of the individual blanking deflector. In the case other than the above, the AND computing circuit 44 outputs an "off" signal to the amplifier 46, and then, the amplifier 46 applies an "off" voltage to the electrode 24 of the individual blanking deflector.

While the k-th data is being processed, the deflection control circuit 130 transmits the (k-1)th data to each logic circuit 41 of the blanking aperture array mechanism 204 in the order of beam array (or in the order of identification number). In the case of FIG. 12, for example, as the (k-1)th data of the beams 1 to 5, each one bit data of "01111" is transmitted from the posterior beam side. The shift register 40 of each beam transmits data to the next shift register 40 in order from the high-order side, based on a clock signal (CLK1). For example, with respect to the (k-1)th data of the beams 1 to 5, based on clock signals of five times, one bit data "1" is stored in the shift register 40 of the beam 1. One bit data "1" is stored in the shift register 40 of the beam 2. One bit data "1" is stored in the shift register 40 of the beam 3. One bit data "1" is stored in the shift register 40 of the beam 4. One bit data "0" is stored in the shift register 40 of the beam 5. After the k-th irradiation time has been completed, the deflection control circuit 130 outputs the (k-1)th read signal. Based on the (k-1)th read signal, the register 42 of each beam reads the (k-1)th data of each beam, from the shift register 40. Similarly, it should proceed to the first data processing.

The AND computing circuit 44 shown in FIG. 7 may be omitted. However, it is effective in that a beam can be controlled to be "off" by the AND computing circuit 44 when not being able to obtain a beam off state because of trouble of an element of the logic circuit 41. Although the case of FIG. 7 uses a data transmission channel for one bit where the shift registers are arranged in series, it is also preferable to use a plurality of parallel transmission channels in order to perform controlling by data of two or more bits, which further increases the speed of transmission.

In the determination step (S124), the determination unit 92 determines whether the transmitted data of the k-th divided shot is the k'-th data or not, where k' is described below. In the example of FIG. 10B, since the switch beam (beam "b") executes the first and second divided shots and the reference beam (beam "a") executes the third and subsequent divided shots, it is set that k'=3. When the data of the k-th divided shot is the k'-th data, it proceeds to the beam switching step (S126). When the data of the k-th divided shot is not the k'-th data, it proceeds to the k-th divided shot step (S128).

In the case where shot is performed in order from the divided shot having a shorter irradiation time, since the reference beam (beam "a") executes the first to eighth divided shots and the switch beam (beam "b") executes the ninth and subsequent divided shots, it is set that k'=9.

In the beam switching step (S126), when the transmitted data of the k-th divided shot is the k'-th data, the beam shift processing unit 94 outputs a beam shift signal for collectively deflecting the entire multi-beams 20 to the deflection control circuit 130 so that the beam to irradiate each pixel may be switched between the reference beam and the switch beam described above. The deflection control circuit 130 outputs a deflection signal for collectively deflecting the entire multi-beams 20 to the DAC amplifier 132. Then, the DAC amplifier 132 converts the deflection signal being a digital signal into a deflection voltage being analog to be applied to the deflector 209. Thereby, as shown in FIG. 9B, by performing collective deflection of the entire multi-beams 20, the beam to irradiate each pixel is switched between the reference beam and the switch beam. In the case of FIG. 10B, since the divided shots taken charge of by the switch beam (beam "b") are precedently performed, when a divided shot is executed in accordance with the data of the third divided shot, the switch beam (beam "b") is switched to the reference beam (beam "a").

In the k-th divided shot irradiation step (S128), under the control of the writing control unit 84, the writing mechanism 150 irradiates the target object 101 with the k-th divided shot using the electron multi-beams 20 while being synchronized with the movement of the XY stage 105. Here, the divided shot is performed with the beam corresponding to the k-th divided shot.

In the determination step (S130), the determination unit 96 determines whether all of a plurality of divided shots corresponding to one shot have been completed. If all the divided shots corresponding to one shot have been completed, it proceeds to the following shot. If not yet completed, it proceeds to the addition step (S132).

In the addition step (S132), the addition unit 98 adds 1 to k to be a new k. Then, it returns to the k-th data transmission step (S122). The steps from the k-th data transmission step (S122) to the addition step (S132) are repeated until it is determined in the determination step (S130) that all of a plurality of divided shots corresponding to one shot have been completed.

Thus, the writing mechanism 150 performs, with respect to the pixel concerned, a plurality of corresponding divided shots becoming beam "on" in a plurality of divided shots continuously irradiating the same pixel, using a plurality of beams while switching a beam for the plurality of corresponding divided shots to another between a plurality of beams by collective deflection of the multi-beams 20. By applying a plurality of beams to the same pixel 36 while performing a plurality of divided shots, even if there is a dose error due to a processing precision error in the hole 22 for forming each beam, it is possible to equalize the errors of the dose.

Figure 13:
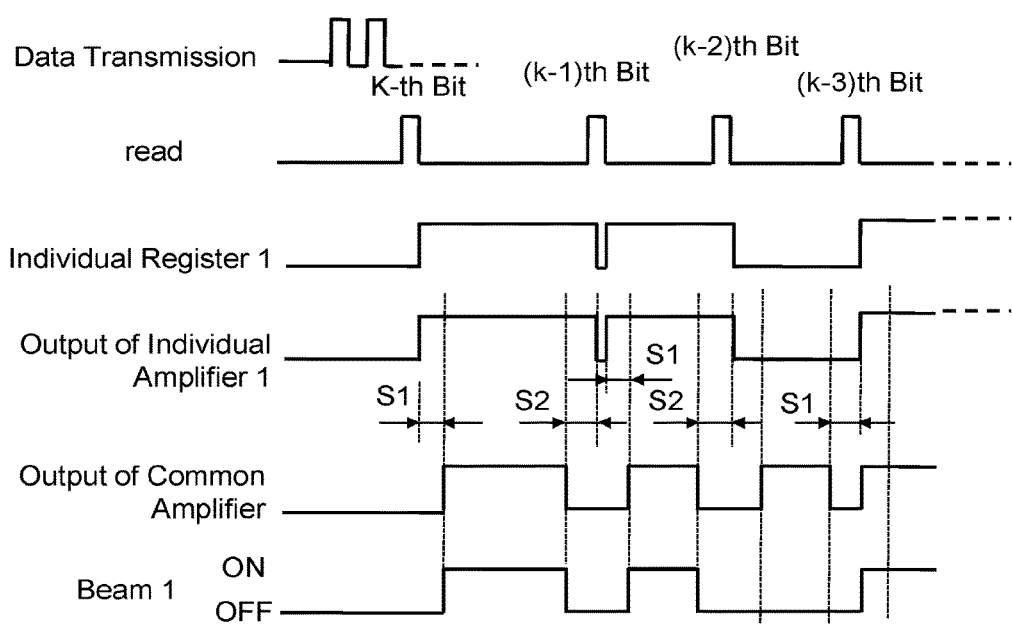
FIG. 13 is a timing chart showing a beam on/off switching operation with respect to a part of a plurality of divided shots during one shot according to the first embodiment.

FIG. 13 is a timing chart showing a beam on/off switching operation with respect to a part of a plurality of divided shots during one shot according to the first embodiment. FIG. 13 shows one beam (beam 1) in a plurality of beams configuring multi-beams, for example. Here are shown, for example, from the k-th to the (k-3)th divided shots of the beam 1. In the irradiation time array data, for example, the k-th is "1", the (k−1)th is "1", the (k−2)th is "0", and the (k−3)th is "1".

First, responsive to input of the k-th read signal, the individual register 42 outputs an on/off signal, based on a stored data (1 bit) of the k-th bit.

Since the k-th data indicates "on", the individual amplifier 46 (individual amplifier 1) outputs an "on" voltage to be applied to the blanking electrode 24 for the beam 1. On the other hand, the logic circuit 131 for common blanking switches "on" or "off" depending upon timing data of each divided shot used in the shot concerned. The common blanking mechanism outputs an "on" signal during the irradiation time of each divided shot. When a plurality of divided shots of the shot concerned are configured by four divided shots whose respective irradiation time periods are 512Δ, 256Δ, 64Δ, and 32Δ, for example, if Δ=1 ns, the irradiation time of the first divided shot is 512Δ=512 ns. The irradiation time of the second divided shot is 256Δ=256 ns. The irradiation time of the third divided shot is 64Δ=64 ns. The irradiation time of the fourth divided shot is 32Δ=32 ns. In the logic circuit 131, when timing data of each divided shot is input into the register 50, controlling is performed such that the register 50 outputs the "on" data of the k-th, the counter 52 counts the irradiation time of the k-th divided shot, and it becomes "off" after the irradiation time has passed. Concerning omitted divided shots which have not been selected in the divided shots into which one shot is divided, their timing data is not input, and corresponding irradiation time array data is not transmitted, thereby efficiently reducing the writing time.

Compared with on/off switching of the individual blanking mechanism, the common blanking mechanism performs on/off switching after the voltage stabilization time (settling time) S1/S2 of the amplifier 46 has passed. In the example of FIG. 13, after the individual amplifier 1 has become "on" and the settling time S1 of the individual amplifier 1 at switching from "off" to "on" has passed, the common amplifier becomes "on". Thereby, beam irradiation at an unstable voltage at the time of rise of the individual amplifier 1 can be avoided. Then, the common amplifier becomes "off" after the irradiation time of the k-th divided shot concerned has passed. Consequently, in the case of both the individual amplifier and the common amplifier being "on", an actual beam becomes "on" to irradiate the target object 101. Therefore, it is controlled such that the "on" time period of the common amplifier is the irradiation time of the actual beam. On the other hand, in the case of the individual amplifier 1 becoming "off", after the common amplifier becomes "off" and the settling time S2 has passed, the individual amplifier 1 becomes "off". Thereby, beam irradiation at an unstable voltage at the fall time of the individual amplifier 1 can be avoided.

As described above, in addition to controlling on/off switching of each beam by the individual blanking mechanism, by using the common blanking mechanism (logic circuit 131, deflector 212, etc.), beam on/off controlling is collectively performed for the entire multi-beams, and blanking control is performed so that the beam may be in the "on" state only during the irradiation time corresponding to each k-th divided shot. Thereby, each shot of the multi-beams is divided into a plurality of divided shots, each having a different irradiation time, to continuously irradiate the same position.

Figure 14:
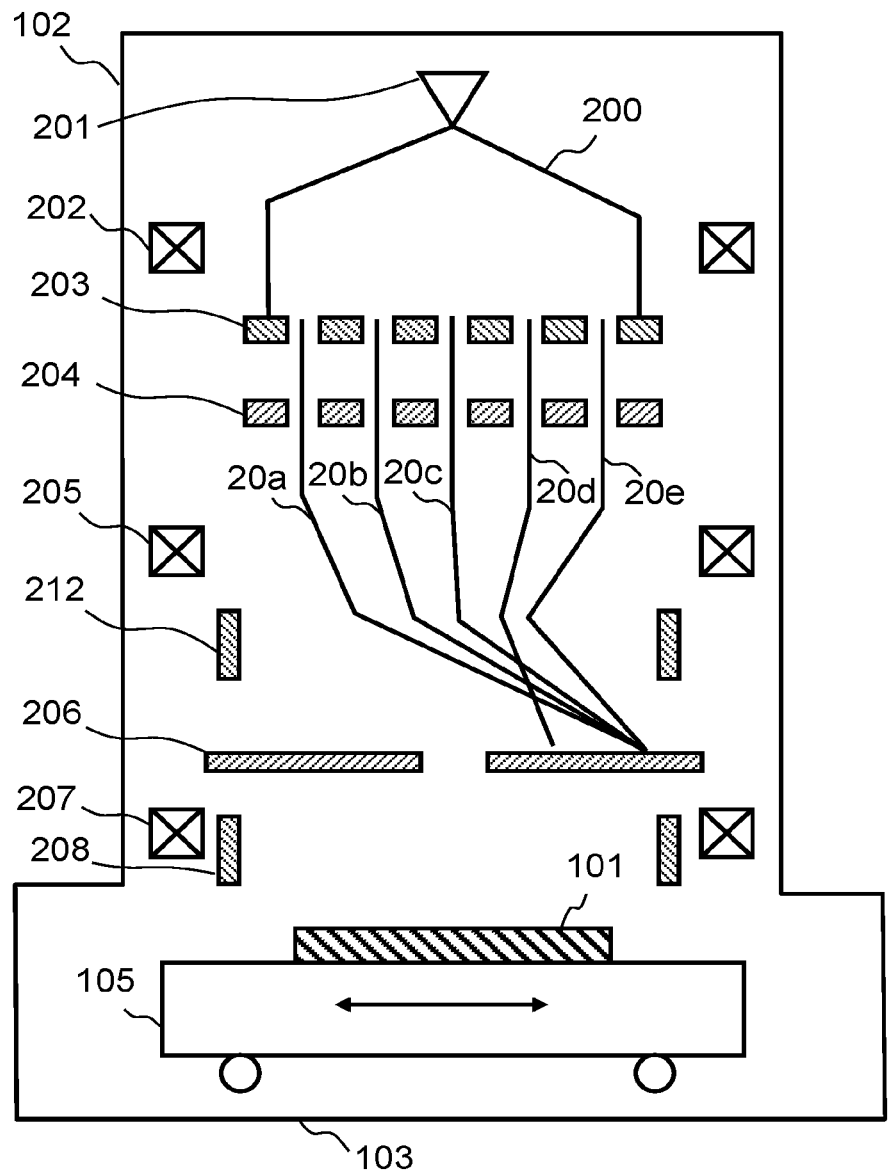
FIG. 14 is a conceptual diagram illustrating a blanking operation according to the first embodiment.

FIG. 14 is a conceptual diagram illustrating a blanking operation according to the first embodiment. The electron beam 200 emitted from the electron gun 201 (emitter) almost perpendicularly (e.g., vertically) illuminates the whole of the forming aperture array substrate 203 by the illumination lens 202. A plurality of holes (openings) each being a quadrangle are formed in the forming aperture array substrate 203. The region including all the plurality of holes 22 is irradiated by the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes 22 of the forming aperture array substrate 203. The multi-beams 20a to 20e individually pass through corresponding blankers (first deflector: individual blanking mechanism) of the blanking aperture array mechanism 204. Each blanker maintains the state of the beam "on" or "off" of at least the electron beam 20 individually passing, based on the individual register 42, during the period of the writing time (irradiation time)+α which is set for a divided shot. As described above, the irradiation time of each divided shot is controlled by the deflector 212 (common blanking mechanism).

The multi-beams 20a to 20e having passed through the blanking aperture array mechanism 204 are reduced by the reducing lens 205, and go toward the hole in the center of the limiting aperture substrate 206. At this stage, the electron beam 20 which was deflected by the blanker of the blanking aperture array mechanism 204 deviates from the hole in the center of the limiting aperture substrate 206 (blanking aperture substrate) and is blocked by the limiting aperture substrate 206. On the other hand, the electron beam 20 which was not deflected by the blanker of the blanking aperture array mechanism 204 passes through the hole in the center of the limiting aperture substrate 206, if it is not deflected by the deflector 212 (common blanking mechanism), as shown in FIG. 1. Blanking control is performed by combination of on/off of the individual blanking mechanism and on/off of the common blanking mechanism so as to control on/off of the beam. Thus, the limiting aperture substrate 206 blocks each beam which was deflected to be the "off" state by the individual blanking mechanism or the common blanking mechanism. Then, each beam of a plurality of divided shots obtained by dividing a one shot is formed by a beam made during a period from becoming "on" to becoming "off" and having passed through the limiting aperture substrate 206. The multi-beams 20 having passed through the limiting aperture substrate 206 are focused by the objective lens 207 so as to be a pattern image of a desired reduction ratio. Respective beams (the whole of the multi-beams 20) having passed through the limiting aperture substrate 206 are collectively deflected in the same direction by the deflectors 208 and 209 in order to irradiate respective beam irradiation positions on the target object 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes of the forming aperture array member 203 by a desired reduction ratio described above.

When beam switching is performed, it is necessary to wait for executing a following divided shot until the output of the DAC amplifier 132 has become settled. Therefore, the writing time is prolonged by this waiting time. However, if the beam pitch is as small as 160 nm, etc., the stabilization time (settling time) of the DAC amplifier 132 can be 100 ns or less. On the other hand, since the maximum irradiation time Ttr per pixel is extraordinarily long such as 10 to 100 µs, the delay of the writing time accompanied by the beam switching can be an ignorable extent.

As described above, according to the first embodiment, a dose error due to an error in the diameter of an aperture for forming multi-beams can be reduced.

Figure 15:
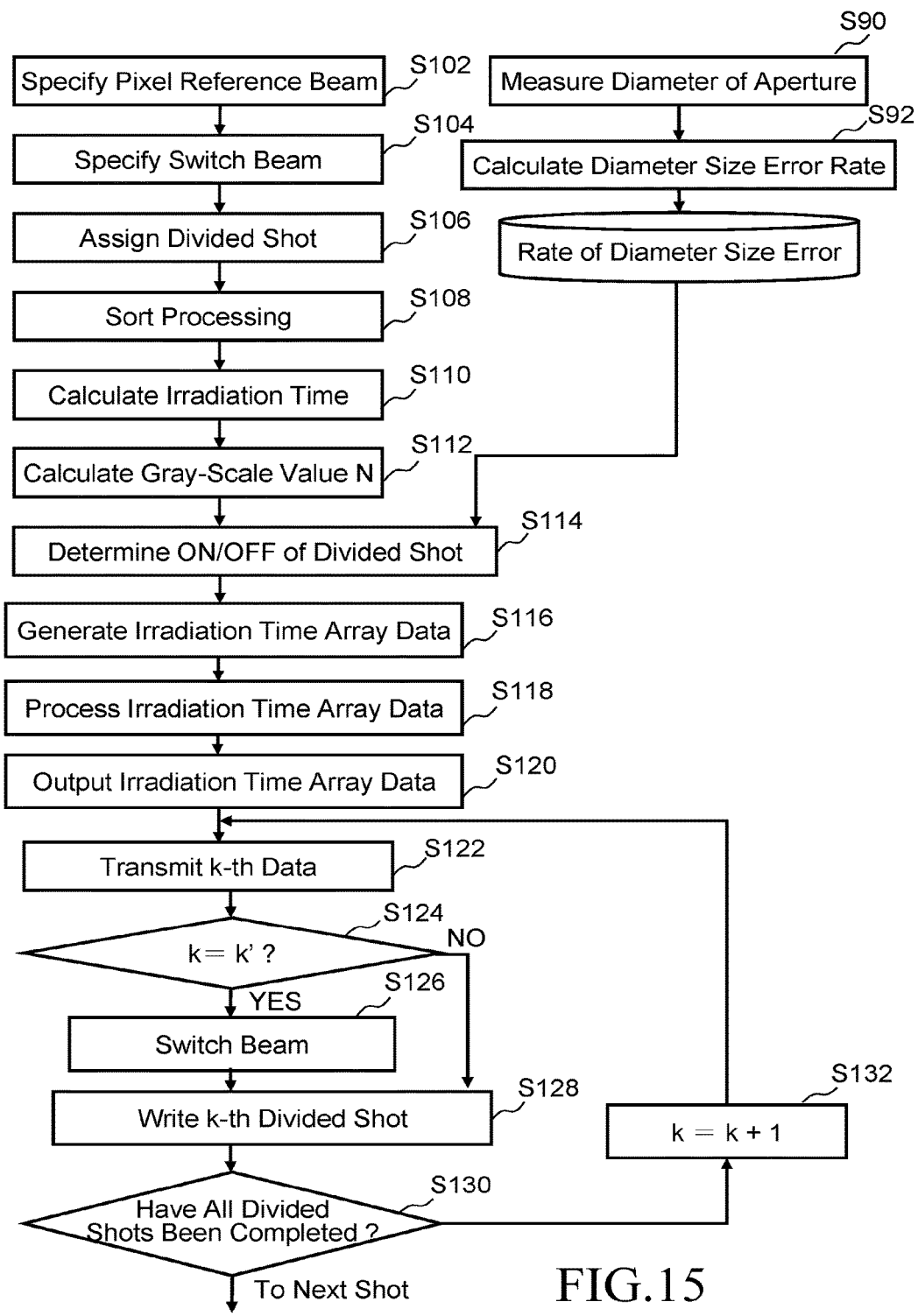
FIG. 15 is a flowchart showing main steps of a modified example of a writing method according to the first embodiment.

FIG. 15 is a flowchart showing main steps of a modified example of a writing method according to the first embodiment. In FIG. 15, the modified example of the writing method according to the first embodiment is the same as each step of FIG. 8 except that an aperture diameter measuring step (S90) and a dose error rate calculation step (S92) are added. The aperture diameter measuring step (S90) and the dose error rate calculation step (S92) should be performed in advance before executing the writing processing. Since the size of the hole 22 (aperture) of the forming aperture array substrate 203 is very small, such as 1 to 2 µm, for example, it is difficult to make the area of the hole 22 equalized. Then, the irradiation time is corrected by determining ON/OFF of a divided shot in consideration of the error of each hole 22.

In the aperture diameter measuring step (S90), the diameter (aperture diameter) of each hole 22 of the manufactured forming aperture array substrate 203 is measured in advance using an optical microscope and an electron microscope.

In the dose error rate calculation step (S92), a dose error rate a(x) is calculated by dividing the measured area of each hole 22 by the design area of the hole 22 concerned. The dose error rate a(x) of each hole 22 is stored in the storage device 140.

The dose error rate a(x) may be defined by computing the area by image processing from a microscope image of each hole 22 of the forming aperture array substrate 203. Alternatively, it may also be defined by measuring a current value of a beam corresponding to the each hole 22 of the multi-beams 20 to obtain a ratio between the measured current value and a target current value. In that case, the dose error rate a(x) includes not only the error of the area of the square hole 22 but also heterogeneity occurring in illuminating the forming aperture array substrate 203 by the electron beam 200. Since the beam current passing the aperture diameter and aperture is small, it is highly possible that a(x) includes an error resulting from a measurement error.

The contents of each step from the reference beam specifying step (S102) to the gray-scale value N calculation step (S112) are the same as those described above.

In the divided shot ON/OFF determination step (S114), the determination unit 88 determines, for each pixel 36, a plurality of corresponding divided shots to be beam. "on" so that a dose error of each beam resulting from an aperture error (opening area error) of a plurality of holes 22 for forming the multi-beams 20 may be corrected. The irradiation time t(x) acquired for each pixel 36 is defined by the following equation (2) using an excess-and-deficiency time $\delta T(x)$, a dose error rate $a_k$ of a beam taking charge of each divided shot, an integer $w_k$ indicating either value 0 or 1, and an irradiation time $T_k$ of the k-th divided shot inn divided shots. x indicates a coordinate of the pixel 36. With respect to the dose error rate $a_k$ of the beam taking charge of each divided shot of each pixel 36, a dose error rate a(x) of a beam to be used is read from the storage device 140. The divided shot whose integer $w_k$ is 1 is determined to be ON, and the divided shot whose integer $w_k$ is 0 (zero) is determined to be OFF.

$$t(x) = \delta T(x) + \sum_{k=1}^{n} w_k(x) a_k T_k \quad (2)$$

Figure 16:
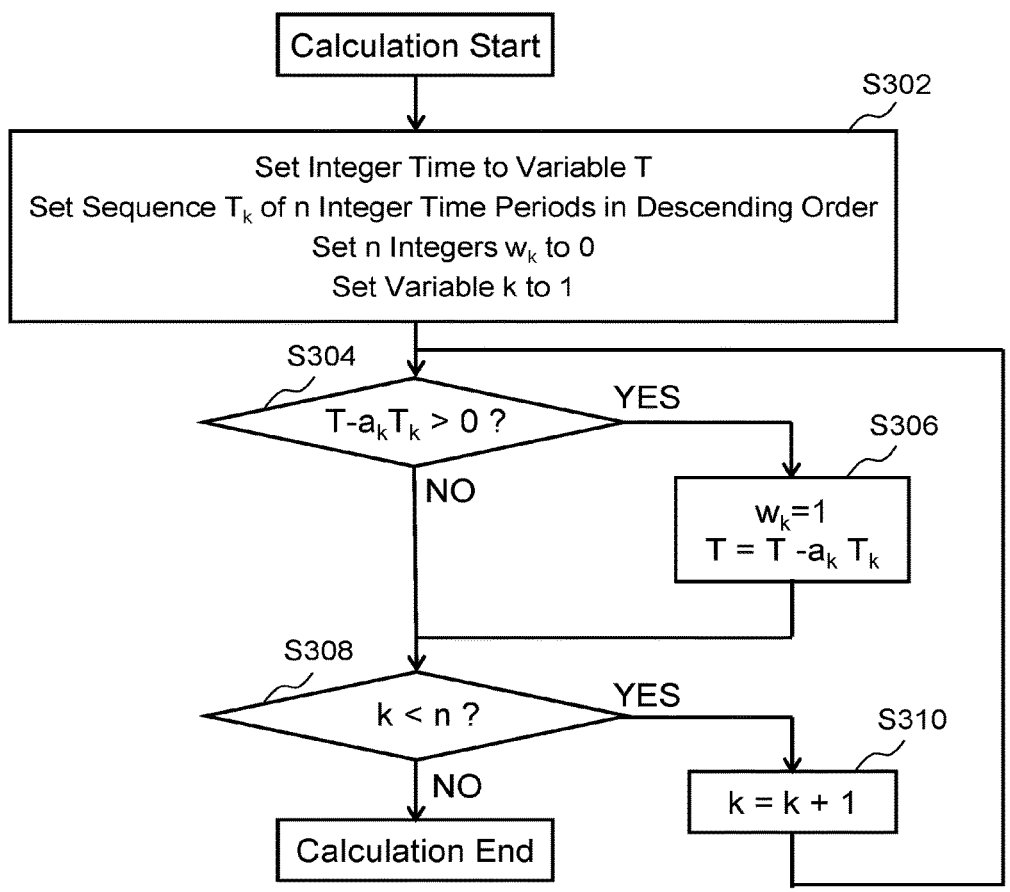
FIG. 16 is a flowchart showing the step of a modified example of a method for determining ON or OFF of a divided shot according to the first embodiment.

FIG. 16 is a flowchart showing the step of a modified example of a method for determining ON or OFF of a divided shot according to the first embodiment. The determination unit 88 performs each step of the flowchart shown in FIG. 16.

In an initial setting step (S302), a variable T=N$\Delta$ is set. When converting the gray-scale value N of an arbitrary irradiation time t for irradiating each pixel 36 into a binary number, it is preferable to define to use a value of a possible larger number of digits. Therefore, the sequence $T_k$ of n integer time periods is set in descending order. Here, n=10 and the sequence $T_k$={512$\Delta$(=T1), 256$\Delta$(=T2), 128$\Delta$(=T3), 64$\Delta$(=T4), 32$\Delta$(=T5), 16$\Delta$(=T6), 8$\Delta$(=T7), 4$\Delta$(=T8), 2$\Delta$(=T9), $\Delta$(=T10)} are set. n integers $w_k$(s) are all set to "0", and the variable k is set to "1".

In a determination step (S304), it is determined whether a variable T$-a_k \cdot T_k$>0. If T$-a_k \cdot T_k$>0, it proceeds to a setting step (S306). If not T$-a_k \cdot T_k$>0, it proceeds to a determination step (S308).

In the setting step (S306), $w_k$=1 is set. Moreover, T=T$-a_k \cdot T_k$ is calculated. After the calculation, it proceeds to the determination step (S308).

In the determination step (S308), it is determined whether the variable k<n. If k<n, it proceeds to an addition step (S310). If not k<n, it ends.

In the addition step (S310), 1 is added to the variable k (k=k+1). Then, it returns to the determination step (S304). Then, steps form the determination step (S304) to the addition step (S310) are repeated until it becomes "not k<n" in the determination step (S308).

If setting the smallest value in $T_k$ to $T_{min}$, it becomes 0≤|$\delta T(x)$|<$T_{min}$ by determining ON/OFF of a divided shot in accordance with the flowchart shown in FIG. 16. On the other hand, when determining ON/OFF of a divided shot in accordance with the flowchart shown in FIG. 11, there is a possibility of |$\delta T(x)$|>$T_{min}$. Although the irradiation time of the pixel 36 concerned is T=500$\Delta$, for example, in the irradiation time calculation step (S110), now, it is assumed that the irradiation time required for the pixel concerned in order to correct a beam dose error resulting from an aperture error is T=501.3$\Delta$, for example. In that case, the value of the right-hand side of the equation (1) is 500$\Delta$ by determining ON/OFF of a divided shot in accordance with the flowchart of FIG. 11. Therefore, the excess-and-deficiency time $\delta T(x)$ is 1.3$\Delta$, and it becomes |$\delta T(x)$|>$T_{min}$(=$\Delta$). By contrast, the value of the right-hand side of the equation (2) is 501$\Delta$ by determining ON/OFF of a divided shot in accordance with the flowchart shown in FIG. 16. Therefore, in that case, the excess-and-deficiency time $\delta T(x)$ is 0.3$\Delta$, and it becomes 0≤|$\delta T(x)$|<$T_{min}$(=$\Delta$). Therefore, the absolute value of the excess-and-deficiency time $\delta T(x)$ can be made small. Thus, the difference between the irradiation time required for the pixel concerned in order to correct a beam dose error resulting from an aperture error and the irradiation time of actual irradiation can be made small.

Furthermore, when $\delta T(x)$>$T_{min}$/2, it is also preferable to re-determine $w_k$ by using the variable T=N$\Delta$+$T_{min}$ instead of the variable T=N$\Delta$ in the initial setting step (S302). Although the irradiation time of the pixel 36 concerned is T=500$\Delta$, for example, in the irradiation time calculation step (S110), now, it is assumed that the irradiation time required for the pixel concerned in order to correct a beam dose error resulting from an aperture error is T=500.7Δ, for example. In that case, the value of the second term in the right-hand side of the equation (2) is 500Δ by determining ON/OFF of a divided shot in accordance with the flowchart of FIG. 16. Therefore, δT(x) in that case is 0.7Δ. However, the value of the second term in the right-hand side of the equation (2) becomes 501Δ by adding $T_{min}=\Delta$ to the variable T. Thus, δT(x) in that case is −0.3Δ, and therefore, the absolute value of the excess-and-deficiency time δT(x) can be made small. Accordingly, the difference between the irradiation time required for the pixel concerned in order to correct a beam dose error resulting from an aperture error and the irradiation time of actual irradiation can be made small.

When a part or all of aperture areas are individually smaller than a design value, and at least one of $a_k(s)$ is $a_k<1$, even if all $w_k(s)$ are set to 1, there is a possibility of $|\delta T(x)|>T_{min}$. That is, the maximum value which NΔ can be is the sum of all $T_k(s)$. When NΔ is close to this value, even if all $w_k(s)$ are set to 1, there is a case where the sum of $(a_k \cdot T_k)$ in the right-hand side of the equation (2) is smaller than NΔ. In that case, the clock of the counter 52 is changed to a low value according to the measured $a_k$ value, and then, writing control is performed. That is, if the clock of the counter 52 is made low, the quantization time Δ in terms of control becomes increased. Therefore, since the same exposure amount can be obtained by smaller N, it becomes possible to make the maximum value of NΔ required for exposure always smaller than the sum of $(a_k \cdot T_k)$.

The contents of each step after the irradiation time array data generation step (S116) are the same as those described above.

As described above, according to the modified example of the first embodiment, it is possible, during the irradiation time, to perform a plurality of divided shots while switching a beam between two beams, and further, to correct dose errors. Therefore, dose errors due to an error of production of an aperture diameter for forming multi-beams and an error of measurement for calibration can further be reduced.

Second Embodiment

The first embodiment aims to equalize the variation in beam current by assigning each of a plurality of divided shots having different irradiation time periods to either of two beams. However, as described above, in each exposure of n-time divided shots, the ratio of contribution of variation in beam current to the dose for exposing a pixel is proportional to the exposure time of each divided shot. Therefore, it is desirable that the total of irradiation time for irradiating the pixel 36 concerned with one of two assigned beams and the total of irradiation time for irradiating the pixel 36 concerned with the other of the two assigned beams become closer to equalized.

FIGS. 17A and 17B show an example of assignment between a plurality of divided shots and beams in a comparative example of the second embodiment. As described with reference to FIG. 10A, since the irradiation time of each divided shot shown in FIG. 17A uses a value of each digit of a binary number, it is necessary to totalize the irradiation time periods each being 256Δ or less in order to acquire almost the same irradiation time as 512Δ which is the highest order irradiation time of a divided shot. Therefore, in order that the total of irradiation time for irradiating the pixel 36 concerned with one of two assigned beams and the total of irradiation time for irradiating the pixel 36 concerned with the other one of the two assigned beams may become closer to equalized, as shown in FIG. 17B, for example, when a switch beam (beam "b") takes charge of a divided shot of 512Δ, it is needed that a reference beam (beam "a") takes charge of all the divided shots each having irradiation time of 256Δ or below. However, in this assignment method, there is a possibility that a required irradiation time is 511Δ or less depending on the pixel 36. In that case, the divided shot of 512Δ becomes beam "off", and the beam "b" is not used, which makes equalization of variation in beam current difficult. Therefore, a divided shot having a long irradiation time which is at a high order in a plurality of divided shots is preferably assigned to a plurality of beams. In addition, for example, as to a divided shot having the irradiation time of 64Δ or less which is at a low order in a plurality of divided shots, since its irradiation time is short from the first, even if variation occurs in beam current, the variation ratio contributing to the exposure dose is small enough to allow.

FIGS. 18A and 18B show an example of assignment between a plurality of divided shots and beams according to the second embodiment. In the second embodiment, at least one of a plurality of divided shots is divided into a plurality of sub divided shots. In the case of FIG. 18A, as to a plurality of divided shots shown in FIG. 10A, the divided shot having the irradiation time of 512Δ being the top and the divided shot having the irradiation time of 256Δ being the second from the top are individually divided into two sub divided shots. That is, the divided shot having the irradiation time of 512Δ is divided into two sub divided shots each having the irradiation time of 256Δ. The divided shot having the irradiation time of 256Δ is divided into two sub divided shots each having the irradiation time of 128Δ. Other divided shots are the same as those in FIG. 10A.

The structure of the writing apparatus 100 according to the second embodiment is the same as that in FIG. 1. The flowchart showing main steps of the writing method of the second embodiment is the same as that of FIG. 8 or FIG. 15. The contents of the present embodiment are the same as those of the first embodiment except what is specifically described below.

The contents of the reference beam specifying step (S102) and the switch beam specifying step (S104) are the same as those of the first embodiment.

In the divided shot assigning step (S106), for each pixel 36 (unit irradiation region) of the target object 101 per beam of the multi-beams 20, the assignment unit 76 assigns each of a plurality of divided shots, which are obtained by dividing a shot of the maximum irradiation time Ttr and each of which has a different irradiation time to continuously irradiate the same pixel 36, to at least one of a plurality of beams that can be switched by collective deflection of the multi-beams 20. According to the second embodiment, the assignment unit 76 assigns each of a plurality of divided shots to at least one of a plurality of beams so that totals of the irradiation time periods for irradiating the pixel 36 concerned may become closer to equalized as much as possible between or among assigned beams. Therefore, the assignment unit 76 assigns each of a plurality of sub divided shots and remaining divided shots that were not divided into sub divided shots to one of a plurality of beams. According to the second embodiment, particularly, sub divided shots are individually assigned to one of a plurality of beams.

With respect to each pixel, for example, the assignment unit 76 assigns one of two sub divided shots each having the irradiation time tk of 256Δ, which is obtained by dividing the irradiation time tk of 512Δ, to a switch beam (beam "b"), and the other of the two sub divided shots each having the irradiation time tk of 256Δ to a reference beam (beam "a").

The assignment unit 76 assigns one of two sub divided shots each having the irradiation time tk of 128Δ, which is obtained by dividing the irradiation time tk of 256Δ, to a switch beam (beam "b"), and the other of the two sub divided shots each having the irradiation time tk of 128Δ to a reference beam (beam "a"). The assignment unit 76 assigns a divided shot having the irradiation time tk of 128Δ to a switch beam (beam "b"). The assignment unit 76 assigns, to a reference beam (beam "a"), a divided shot having the irradiation time tk of 64Δ, a divided shot having the irradiation time tk of 32Δ, a divided shot having the irradiation time tk of 16Δ, a divided shot having the irradiation time tk of 8Δ, a divided shot having the irradiation time tk of 4Δ, a divided shot having the irradiation time tk of 2Δ, and a divided shot having the irradiation time tk of Δ.

It should be set in advance which divided shot is assigned to a reference beam and which divided shot is assigned to a switch beam. Here, a plurality of divided shots and a plurality of sub divided shots should be assigned to the actual reference beam and the actual switch beam which are specified for each pixel.

In the sort processing step (S108), the sort processing unit 78 performs processing for sorting execution orders of divided shots to be collected per beam. By sorting by beam unit, the times of beam switching operations can be reduced, and therefore, the writing time can be shortened. In the case of FIG. 18B, similarly to FIG. 10B, the divided shots of which a switch beam (beam "b") takes charge are previously collected, and then, the divided shots of which a reference beam (beam "a") takes charge follow them.

In the example of FIG. 18B, with respect to a plurality of divided shots of which the same beam takes charge, a divided shot having a longer irradiation time tk is precedently performed, but it is not limited thereto. It is also preferable to precedently perform a divided shot having a shorter irradiation time tk in a plurality of divided shots of which the same beam takes charge. Alternatively, a divided shot may be performed at a random order regarding the irradiation time tk in a plurality of divided shots of which the same beam takes charge.

By using sub divided shots, as shown in FIG. 18B, the total irradiation time of a reference beam (beam "a") is 511Δ, and the total irradiation time of a switch beam (beam "b") is 512Δ. Therefore, the totals of irradiation time periods for irradiating the pixel 36 concerned can be closer to equalized between or among assigned beams. The contents of each step after the irradiation time calculation step (S110) are the same as those of the first embodiment.

When a divided shot is divided into a plurality of sub divided shots, the number of times of waiting for the voltage stabilization time (settling time) of the amplifier 46 of an individual blanking mechanism to be performed before a next divided shot (or sub divided shot) increases by the number of increased sub divided shots. However, compared with the maximum irradiation time Ttr (for example, 10 to 100 μs) per pixel, since the settling time is substantially short, the delay of the writing time can be an ignorable extent.

According to the second embodiment, as described above, the totals of irradiation time periods for irradiating the pixel 36 concerned can be closer to equalized between or among assigned beams. Accordingly, equalization of the variation in beam current can be further advanced.

Third Embodiment

According to the second embodiment, equalization of the variation in beam current is achieved using two beams. However, when there are large errors in the diameters of apertures having been used for forming two beams, the equalization effect is small. Therefore, the more the number of beams assigned to one pixel 36 is, the greater the equalization effect becomes.

FIGS. 19A to 19D illustrate beam switching performed in the middle of applying a plurality of divided shots according to the third embodiment. FIG. 19A shows the case of performing a shot to the target object by using multi-beams 20 of 5×5 (rows by columns). Specifically, for example, FIG. 19A shows the case where a beam "a" of the multi-beams 20, as a reference beam, takes charge of the first pixel 36 from the left in the top row of the grid 29 concerned ("grid 29 of interest" or "target grid 29"). The beam "a" is the second beam from the left in the second row from the top of the multi-beams 20 of 5×5 irradiating the irradiation region 34 which can be irradiated at a time (one shot of the multi-beams). After, for example, the first to seventh divided shots in a plurality of divided shots have been performed with the beam "a", the beam irradiation position of the multi-beams 20 of 5×5 is shifted upward in FIG. 19A by one beam pitch by collective deflection of the deflector 209. Thereby, as shown in FIG. 19B, the beam which takes charge of the first pixel 36 from the left in the top row of the grid 29 concerned is switched to the beam "b" from the beam "a". Then, after the eighth and ninth divided shots in a plurality of divided shots have been performed with the beam "b", the beam irradiation position of the multi-beams 20 of 5×5 is shifted leftward in FIG. 19B by one beam pitch by collective deflection of the deflector 209. By this, as shown in FIG. 19C, the beam which takes charge of the first pixel 36 from the left in the top row of the grid 29 concerned is switched to the beam "c" from the beam "b". Then, after the tenth and eleventh divided shots in a plurality of divided shots have been performed with the beam "c", the beam irradiation position of the multi-beams 20 of 5×5 is shifted downward in FIG. 19C by one beam pitch by collective deflection of the deflector 209. By this, as shown in FIG. 19D, the beam which takes charge of the first pixel 36 from the left in the top row of the grid 29 concerned is switched to the beam "d" from the beam "c". Then, the beam "d" takes charge of the remaining divided shots. Thereby, the first pixel 36 from the left in the top row of the grid 29 concerned is multiply exposed by the four beams "a" to "d". Therefore, even when the diameter of the hole 22 (aperture) of the forming aperture array substrate 203 for forming the beam "a" has a processing error against the design value, the error of the beam current amount can be further equalized by superimposingly applying the beams "b", "c", and "d". As a result, the error of the dose to the pixel concerned can be reduced. For example, by applying the four beams "a" to "d", statistical errors of variation in beam current irradiating the pixel 36 concerned can be reduced compared with applying the beam "a" only. For example, if it is possible to make the irradiation time periods of the four beams the same, the statistical error of variation in beam current can be reduced to $1/4^{(1/2)}$ times compared with applying the beam "a" only.

Although in the examples of FIGS. 19A to 19D divided shots are applied in order of the reference beam (beam "a"), switch beam (beam "b"), switch beam (beam c), and switch beam (beam d), it is not limited thereto. For example, it is also preferable to perform divided shots in order of the switch beam (beam "d"), switch beam (beam "c"), switch beam (beam "b"), and reference beam (beam "a") as will be described later.

Although the examples of FIGS. 19A to 19D show the case of collectively deflecting the multi-beams 20 of 5×5 by one beam pitch by the deflector 209 in order of upward (y direction), leftward (−x direction), and downward (−y direction), it is not limited thereto. It is sufficient that the four beams are applied to a corresponding pixel in whatever order. Moreover, the beam shift amount is not limited to the amount of one beam pitch. It may be two or more beam pitches. As long as the beam shift amount is an integral multiple of the beam pitch deflectable by the deflector 209, switching to any one of beams can be performed.

FIGS. 20A and 20B show an example of assignment between a plurality of divided shots and beams according to the third embodiment. In the third embodiment, at least one of a plurality of divided shots is divided into a plurality of sub divided shots. In the case of FIG. 20A, as to a plurality of divided shots shown in FIG. 10A, the divided shot having the irradiation time of 512Δ being the top is divided into four sub divided shots, and the divided shot having the irradiation time of 256Δ being the second from the top is divided into two sub divided shots. In the case of FIG. 18A, there remains the sub divided shot having the irradiation time of 256Δ which is the same as the divided shot having the irradiation time of 256Δ being the second from the top. On the other hand, in the case of FIG. 20A, the divided shots having the irradiation time of the top and the second from the top are divided into six sub divided shots each having the irradiation time of 128Δ which is the same as the divided shot having the irradiation time of 128Δ being the third from the top. Then, the sub divided shots are individually assigned to one of the four beams a, b, c, and d. Other divided shots are the same as those in FIG. 18A.

The structure of the writing apparatus 100 according to the third embodiment is the same as that in FIG. 1. The flowchart showing main steps of the writing method of the third embodiment is the same as that of FIG. 8 or FIG. 15. The contents of the present embodiment are the same as those of the first embodiment except what is specifically described below.

The contents of the reference beam specifying step (S102) is the same as that of the first embodiment.

In the switch beam specifying step (S104), the specifying unit 74 specifies, for each pixel 36, a beam that can be switched by collective deflection of multi-beams, as a switch beam to irradiate the pixel concerned. In the example of FIGS. 19A to 19D, three switch beams (the beams "b", "c", and "d") are specified with respect to the reference beam (beam "a").

In the divided shot assigning step (S106), for each pixel 36 (unit irradiation region) of the target object 101 per beam of the multi-beams 20, the assignment unit 76 assigns each of a plurality of divided shots, which are obtained by dividing a shot of the maximum irradiation time Ttr and each of which has a different irradiation time to continuously irradiate the same pixel 36, to at least one of a plurality of beams that can be switched by collective deflection of the multi-beams 20. According to the third embodiment, the assignment unit 76 assigns each of a plurality of divided shots to at least one of a plurality of of beams so that totals of the irradiation time periods for irradiating the pixel 36 concerned may become closer to equalized as much as possible between or among assigned beams. Therefore, the assignment unit 76 assigns each of a plurality of sub divided shots and remaining divided shots that were not divided into sub divided shots to one of a plurality of beams. According to the third embodiment, particularly, sub divided shots are individually assigned to one of more plurality of beams.

With respect to each pixel, the assignment unit 76 assigns, for example, the first one of four sub divided shots each having the irradiation time tk of 128Δ, which is obtained by dividing the irradiation time tk of 512Δ, to a switch beam (beam "b"). Moreover, the assignment unit 76 assigns the second one of the four sub divided shots each having the irradiation time tk of 128Δ to a switch beam (beam "c"). Further, the assignment unit 76 assigns the third one of the four sub divided shots each having the irradiation time tk of 128Δ to a switch beam (beam "b"). Furthermore, the assignment unit 76 assigns the fourth one of the four sub divided shots each having the irradiation time tk of 128Δ to a switch beam (beam "a"). The assignment unit 76 assigns one of two sub divided shots each having the irradiation time tk of 128Δ, which is obtained by dividing the irradiation time tk of 256Δ, to a switch beam (beam "d"), and the other of the two sub divided shots each having the irradiation time tk of 128Δ to a reference beam (beam "c"). Further, the assignment unit 76 assigns a divided shot having the irradiation time tk of 128Δ to a switch beam (beam "b"). Moreover, the assignment unit 76 assigns, to a reference beam (beam "a"), a divided shot having the irradiation time tk of 64Δ, a divided shot having the irradiation time tk of 32Δ, a divided shot having the irradiation time tk of 16Δ, a divided shot having the irradiation time tk of 8Δ, a divided shot having the irradiation time tk of 4Δ, a divided shot having the irradiation time tk of 2Δ, and a divided shot having the irradiation time tk of Δ.

It should be set in advance which divided shot is assigned to a reference beam and which divided shot is assigned to a switch beam. Here, a plurality of divided shots and a plurality of sub divided shots should be assigned to the actual reference beam and the actual switch beam which are specified for each pixel.

In the sort processing step (S108), the sort processing unit 78 performs processing for sorting execution orders of divided shots to be collected per beam. By sorting by beam unit, the times of beam switching operations can be reduced, and therefore, the writing time can be shortened. In the case of FIG. 20B, the divided shots are taken care of by a switch beam (beam "d"), a switch beam (beam "c"), a switch beam (beam "b"), and a reference beam (beam "a") in order.

In the example of FIG. 20B, with respect to a plurality of divided shots of which the same beam takes charge, a divided shot having a longer irradiation time tk is precedently performed, but it is not limited thereto. It is also preferable to precedently perform a divided shot having a shorter irradiation time tk in a plurality of divided shots of which the same beam takes charge. Alternatively, a divided shot may be performed at a random order regarding the irradiation time tk in a plurality of divided shots of which the same beam takes charge.

By using sub divided shots, as shown in FIG. 20B, the total irradiation time of a reference beam (beam "a") is 255Δ, the total irradiation time of a switch beam (beam "b") is 256Δ, the total irradiation time of a switch beam (beam "c") is 256Δ, and the total irradiation time of a switch beam (beam "d") is 256Δ. Therefore, the totals of irradiation time periods for irradiating the pixel 36 concerned can be closer to equalized between or among assigned beams. The contents of each step after the irradiation time calculation step (S110) are the same as those of the first embodiment.

In the determination step (S124), the determination unit 92 determines whether the transmitted data of the k-th divided shot is the k'-th data or not, where k' is described below. In the example of FIG. 20B, since the switch beam (beam "d") executes the first and second divided shots, the switch beam (beam "c") executes the third and fourth divided shots, the switch beam (beam "b") executes the fifth and sixth divided shots, and the reference beam (beam "a") executes the seventh and subsequent divided shots, it is set that k'=3, 5, or 7. When the data of the k-th divided shot is the k'-th data, it proceeds to the beam switching step (S126). When the data of the k-th divided shot is not the k'-th data, it proceeds to the k-th divided shot step (S128).

In the case where shot is performed in order from the divided shot having a shorter irradiation time, since the reference beam (beam "a") executes the first to eighth divided shots, the switch beam (beam "b") executes the ninth and tenth divided shots, the switch beam (beam "c") executes the eleventh and twelfth divided shots, and the switch beam (beam "d") executes the thirteenth, fourteenth, and subsequent divided shots, it is set that k'=9, 11, or 13.

In the beam switching step (S126), as shown in FIGS. 19A to 19D, the beam shift processing unit 94 switches beams for irradiating each pixel in order of the reference beam and the three switch beams by performing collective deflection of the entire multi-beams 20. In the example of FIG. 20B, since divided shots are performed in order of the switch beam (beam "d"), switch beam (beam "c"), switch beam (beam "b"), and reference beam (beam "a"), when applying a divided shot based on the data of the third divided shot, the beam is switched from the switch beam (beam "d") to the reference beam (beam "c"). When applying a divided shot based on the data of the fifth divided shot, the beam is switched from the switch beam (beam "c") to the reference beam (beam "b"). When applying a divided shot based on the data of the seventh divided shot, the beam is switched from the switch beam (beam "b") to the reference beam (beam "a").

According to the third embodiment, since the number of times of switching beams increases up to three times, there is increased the number of times of waiting for a following divided shot until the output of the DAC amplifier 132 has become settled before performing the following divided shot. However, as described above, if the beam pitch is as small as 160 nm, the stabilization time (settling time) of the DAC amplifier 132 can be 100 ns or less. On the other hand, since the maximum irradiation time Ttr per pixel is extraordinarily long such as 10 to 100 µs, the delay of the writing time accompanied by the beam switching can be an ignorable extent. In addition, the number of sub divided shots also increases, the delay of the writing time can also be an ignorable extent.

According to the third embodiment, as described above, equalization of variation in beam current can be achieved using more beams. Moreover, by making the irradiation time periods of beams almost the same, the weight of equalization effect for respective beams can be the same as each other. Furthermore, even when either one of the divided shot having the longest irradiation time and the divided shot having the second-longest irradiation time becomes beam "off", each pixel can be irradiated with four beams.

As described above, the multi beam writing apparatus according to each of Embodiments performs writing using a plurality of beams while independently controlling ON/OFF of each beam and performing deflection control common to the beams. With this writing method, for example, the pixel 36 of the same size as a beam is defined on the surface of the target object 101 so that each pixel 36 can be irradiated with a required dose. Moreover, for the purpose of controlling the size and position of a pattern smaller than the beam size, a gray beam writing method may be used. This method controls the position of a pattern edge by controlling the dose of a pixel overlapped with a pattern edge to be a dose equivalent to or less than the optimal value for the resolution of the resist. In the VSB (variable shaped beam) writing apparatus, an exposure time corresponding to an optimal dose for exposure is used. However, according to the gray beam writing method, whereas an exposure time being the same as that of the VSB writing apparatus is used for the internal portion of a pattern, an exposure time control wide enough from zero exposure time to the optimum exposure time is used corresponding to a pattern occupation ratio in a pixel overlapped with the pattern edge.

Moreover, as described above, the multi beam writing apparatus according to each of Embodiments independently controls the exposure time of each beam by using N bits. If a counter of n bits needs to be arranged for each blanking control circuit, it becomes difficult to manufacture the blanking aperture. On the other hand, as described with reference to FIG. 7, since the multi beam writing apparatus according to each of Embodiments performs a plurality of exposure steps of different exposure time periods by combining an exposure time control with a common counter of n bits and an ON/OFF control for each beam, it can independently control each beam based on the sum of exposure time.

FIGS. 21A and 21B show examples of an exposure sequence in a comparative example to each of Embodiments. As to a multi-beam aperture, since the aperture diameter is very small such as 1 to 2 µm, it is difficult to equalize the aperture area and the current of each beam. Then, as a countermeasure, there is a method of accurately measuring each beam current in order to perform correction based on the exposure time. However, due to a large number of beams, a change of illumination current, and the like, it is difficult to always detect and grasp an accurate current to perform correction.

In such a case, errors of the beam current can be equalized by exposing the same pixel with a plurality of beams. FIG. 21A shows the case of exposing a certain pixel with only the beam "a" when n=6, n being the number of times of divided shots. FIG. 21B shows two control methods in the case of exposing a certain pixel with the beams "a" and "b". FIG. 21B shows n-time exposures with the beam "a" and n-time exposures with the beam "b", using t'=t/2 as a control unit of the exposure time. According to the method of FIG. 21B, the statistical error of variation in beam current can be reduced to $1/\sqrt{2}$ by exposing the same pixel with two beams. By contrast, the amount of data required to expose one pixel becomes double being 2n bits. Therefore, measures are needed such as to double the data transfer speed or to prolong the writing time so as to secure a latency time for data transfer completion. Moreover, it is needed to double the operation frequency of the counter for exposure time control.

In FIG. 21B, all the n-time exposures are performed with two beams. In each of n-time exposures, the ratio of contribution of variation in beam current to the dose for exposing a pixel is proportional to each exposure time. Therefore, from a viewpoint of reducing the variation in the current of each beam, to use a plurality of beams for exposure time periods of 32Δt, 16Δt, and 8Δt has a great effect, whereas to use a plurality of beams for exposure time periods of 4Δt, 2Δt, and Δt has a small effect.

Therefore, as described above, according to each of Embodiments, the writing method of controlling an exposure time of n bits by using a total of exposure time periods for exposing one pixel a plurality of times performs irradiation of a plurality of exposure time periods while switching a beam between two or more beams. In particular, a longer exposure time in a plurality of exposures is executed while switching two or more beams.

FIGS. 22A to 22C show examples of an exposure sequence for comparing Embodiments. In the examples of FIGS. 22A to 22C, the ordinate axis represents beam current and the abscissa axis represents time. Moreover, the examples of FIGS. 22A to 22C show the case of the number of divided shots being n=6. The example of FIG. 22A corresponding to the first embodiment shows the case where the two exposure time periods of 32Δt and 8Δt are executed with the beam "b", and four other exposures are executed with the beam "a". The example of FIG. 22B corresponding to the second embodiment shows the case where the exposure time of 32Δt is divided into two sub exposure time periods each being 16Δt, and the exposure time of 16Δt is divided into two sub exposure time periods each being 8Δt. Then, one of the two sub exposure time periods each being 16Δt is performed with the beam "a", the other of the two sub exposure time periods each being 16Δt is performed with the beam "b", one of the two sub exposure time periods each being 8Δt is performed with the beam "a", the other of the two sub exposure time periods each being 8Δt is performed with the beam "b", the exposure time of 8Δt is performed with the beam "b" and three other exposures are performed with the beam "a". The example of FIG. 22C corresponding to the third embodiment shows the case where the exposure time of 32Δt is divided into four sub exposure time periods each being 8Δt, and the exposure time of 16Δt is divided into two sub exposure time periods each being 8Δt. Then, each of the four sub exposure time periods each being 8Δt is performed with one of the beams "a" to "d", where each of the beams "a" to "d" is used once. Each of the two sub exposure time periods each being 8Δt is performed with one of the beams "c" and "d", where each of the beams "c" and "d" is used once. The exposure time of 8Δt is performed with the beam "b". Three other exposures are performed with the beam "a". When n=6, the total exposure time T of a pixel is 0, Δt, 2Δt, . . . or 63Δt. According to the total exposure time, beam ON/OFF switching is performed six times in the example of FIG. 22A, eight times in the example of FIG. 22B, and ten times in the example of FIG. 22C. It turns out that unbalance of influence of each beam in equalization of variation in the beam current of FIG. 22B is smaller than that of FIG. 22A, and that the effect of equalization of variation in the beam current of FIG. 22C is larger than that of FIG. 22B. Now, the effect of the number of beams for switching without using sub exposure time is described below.

FIG. 23 shows an example of comparing each beam exposure time when writing is performed while switching two beams according to the first embodiment. Depending upon the exposure time, beam ON/OFF in a plurality of exposures changes, and also, the sum of exposure time of the beam "a" and the sum of exposure time of the beam "b" change. From a viewpoint of equalizing errors of beam current, it is desirable for the exposure time periods of the beams "a" and "b" to be almost the same with each other. However, in the example of FIG. 23, there is a difference of 50% or more in many cases. Although the example of FIG. 23 is not optimal as a method of reducing errors of beam current, there is a certain degree of effectiveness. In FIG. 23, when T=7Δt, the exposure time of the beam "b" is 0, and therefore, the effect of equalizing errors of beam current disappears. However, in that case, since the total exposure time itself is short, the influence on writing precision is small. On the other hand, when T=40Δt, exposure is performed with only the beam "b" for a long exposure time, which undesirably has a large influence on writing precision.

FIG. 24 shows an example of comparing each beam exposure time when writing is performed while switching three beams according to a modified example of the first embodiment. In the example of FIG. 24, one pixel is exposed with three beams of "a", "b", and "c". Having increased the number of beams from two to three, even when the total exposure time is 40Δt, since the exposure is performed with two beams of "a" and "c", the equalization effect of beam current can be enhanced compared with the example of FIG. 23.

Embodiments have been explained referring to specific examples described above. However, the present invention is not limited to these specific examples. In the examples described above, a plurality of divided shots irradiate each pixel one time, however it is not limited thereto. It is also preferable to perform multiple writing using m passes. For example, in the case where total irradiation time periods of a plurality of divided shots of each pass of m-pass multiple writing are almost the same with each other, and irradiation time periods of p beams taking charge of a plurality of divided shots for one pass are almost the same with each other, it is possible to reduce the statistical error of variation in the beam current irradiating the pixel 36 to $1/(m \cdot p)^{(1/2)}$ times compared with the case where a plurality of divided shots for one time are performed with only one beam.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:
assigning each divided shot of a plurality of divided shots, for each unit irradiation region of unit irradiation regions of a target object, the unit irradiation region being a unit region to be irradiated by one beam of multi-beams, the unit irradiation region being written by the plurality of divided shots each using a different one of a plurality of sub irradiation time periods obtained by dividing a maximum irradiation time, the plurality of divided shots continuously irradiating a same unit irradiation region in the unit irradiation regions, to at least one of a plurality of beams that can be switched by collective deflection of the multi-beams;
calculating, for the each unit irradiation region, an irradiation time of a beam;
determining, for the each unit irradiation region, whether to make the each divided shot of the plurality of divided shots beam "on" or beam "off" so that a total irradiation time for a plurality of corresponding divided shots to be beam "on" in the plurality of divided shots becomes equivalent to the irradiation time calculated; and applying, to the each unit irradiation region in the unit irradiation regions, the plurality of corresponding divided shots to be beam "on" in the plurality of divided shots continuously irradiating the same unit irradiation region, while switching a beam for irradiating between the plurality of beams by collective deflection of the multi-beams, wherein the plurality of corresponding divided shots to be beam "on" are determined so that a dose error of each beam resulting from an opening area error of a plurality of openings for forming the multi-beams is corrected.

2. The method according to claim 1, wherein the each divided shot of the plurality of divided shots is assigned to the at least one of the plurality of beams so that totals of irradiation time for irradiating the corresponding unit irradiation region in the unit irradiation regions become closest to equalized between assigned beams.

3. The method according to claim 1, wherein
at least one of the plurality of divided shots is divided into a plurality of sub divided shots, and
each sub divided shot of the plurality of sub divided shots and remaining divided shots that were not divided into the plurality of sub divided shots are assigned to one of the plurality of beams.

4. The method according to claim 1, wherein
at least one of the plurality of divided shots is divided into a plurality of sub divided shots, and
the plurality of sub divided shots and remaining divided shots that were not divided into the plurality of sub divided shots are individually assigned to one of the plurality of beams so that totals of irradiation time for irradiating the corresponding unit irradiation region in the unit irradiation regions become closest to equalized between assigned beams.

5. The method according to claim 1, wherein adjacent beams are used as the plurality of beams that can be switched by the collective deflection of the multi-beams.

6. A multi charged particle beam writing method comprising:
assigning each divided shot of a plurality of divided shots, for each unit irradiation region of unit irradiation regions of a target object, the unit irradiation region being an unit region to he irradiated by one beam of multi-beams, the unit irradiation region being written by the plurality of divided shots each using a different one of a plurality of sub irradiation time periods obtained by dividing a maximum irradiation time, the plurality of divided shots continuously irradiating a same unit irradiation region in the unit irradiation regions, to at least one of a plurality of beams that can be switched by collective deflection of the multi-beams;
calculating, for the each unit irradiation region, an irradiation time of a beam;
determining, for the each unit irradiation region, whether to make the each divided shot of the plurality of divided shots beam "on" or beam "off" so that a total irradiation time for a plurality of corresponding divided shots to be beam "on" in the plurality of divided shots becomes equivalent to the irradiation time calculated;
applying, to the each unit irradiation region in the unit irradiation regions, the plurality of corresponding divided shots to be beam "on" in the plurality of divided shots continuously irradiating the same unit irradiation region, while switching a beam for irradiating between the plurality of beams by collective deflection of the multi-beams;

specifying, for the each unit irradiation region, a reference beam to irradiate the corresponding unit irradiation region in the unit irradiation regions; and specifying, for the each unit irradiation region, a beam that can be switched by collective deflection of the multi-beams, as a switch beam to irradiate the corresponding unit irradiation region.

7. The method according to claim 6, further comprising:
performing processing for sorting execution orders of the plurality of divided shots to be collected per beam, when the reference beam and the switch beam are used.

8. The method according to claim 6, wherein at least one of the plurality of divided shots is divided into a plurality of sub divided shots, further comprising:
performing processing for sorting execution orders of each sub divided shot of the plurality of sub divided shots and remaining divided shots that were not divided into the plurality of sub divided shots to be collected per beam, when the reference beam and the switch beam are used.

9. A multi charged particle beam wring apparatus comprising:
an assignment processing circuitry configured to assign each divided shot of a plurality of divided shots, for each unit irradiation region of unit irradiation regions of a target object, the unit irradiation region being a unit region to be irradiated by one beam of multi-beams configured by charged particle beams, the unit irradiation region being written by the plurality of divided shots each using a different one of a plurality of sub irradiation time periods obtained by dividing a maximum irradiation time, the plurality of divided shots continuously irradiating a same unit irradiation region, to at least one of a plurality of beams that can be switched by collective deflection of the multi-beams;

an irradiation time calculation processing circuitry configured to calculate, for the each unit irradiation region, an irradiation time of a beam;

a determination processing circuitry configured to determine, for the each unit irradiation region, whether to make the each divided shot of the plurality of divided shots beam "on" or beam "off" so that a total irradiation time for a plurality of corresponding divided shots to be beam "on" in the plurality of divided shots becomes equivalent to the irradiation time calculated; and a writing mechanism, including a charged particle source, a deflector and a stage on which a target object is placed, configured to write a pattern on the target object with the multi-beams, while applying, to the each unit irradiation region in the unit irradiation regions, the plurality of corresponding divided shots to be beam "on" in the plurality of divided shots continuously irradiating the same unit irradiation region, to switch a beam for irradiating shots between the plurality of beams by collective deflection of the multi-beams, wherein the plurality of corresponding divided shots to be beam "on" are determined so that a dose error of each beam resulting from an opening area error of a plurality of openings for forming the multi-beams is corrected.

* * * * *